(12) United States Patent
Suwa et al.

(10) Patent No.: US 6,727,032 B1
(45) Date of Patent: Apr. 27, 2004

(54) RADIATION-SENSITIVE RESIN COMPOSITION

(75) Inventors: Mitsuhito Suwa, Yokkaichi (JP); Toru Kajita, Yokkaichi (JP); Shin-ichiro Iwanaga, Yokkaichi (JP); Toshiyuki Ota, Tsukuba (JP)

(73) Assignee: JSR Corporation, Tokyo (JP)

( * ) Notice: Subject to any disclaimer, the term of this patent is extended or adjusted under 35 U.S.C. 154(b) by 546 days.

(21) Appl. No.: 08/797,620

(22) Filed: Feb. 7, 1997

(30) Foreign Application Priority Data

| Feb. 9, 1996 | (JP) | 8-046930 |
| Aug. 12, 1996 | (JP) | 8-227344 |
| Dec. 16, 1996 | (JP) | 8-352621 |

(51) Int. Cl.$^7$ ............................. G03F 7/039; G03F 7/30
(52) U.S. Cl. ............... 430/170; 430/270.1; 430/905
(58) Field of Search ............... 430/270.1, 905, 430/170

(56) References Cited

U.S. PATENT DOCUMENTS

| 5,155,188 A | | 10/1992 | Goodall | |
| 5,397,680 A | * | 3/1995 | Schadeli et al. | 430/270.1 |
| 5,399,647 A | * | 3/1995 | Nozaki et al. | 430/270.1 |
| 5,585,222 A | * | 12/1996 | Kaimoto et al. | 430/270.1 |
| 5,660,969 A | * | 8/1997 | Kaimoto | 430/270.1 |
| 5,665,518 A | * | 9/1997 | Maeda et al. | 430/270.1 |
| 5,691,111 A | * | 11/1997 | Iwasa et al. | 430/270.1 |

FOREIGN PATENT DOCUMENTS

WO    WO 95/14048    5/1995

OTHER PUBLICATIONS

Patent Abstracts of Japan, vol. 018, No. 096(P–1694), Feb. 16, 1994, JP–A–05 297591, Nov. 12, 1993.
Patent Abstracts of Japan, vol. 018, No. 387 (P–1773), Jul. 20, 1994, JP–A–06 110214, Apr. 22, 1994.

\* cited by examiner

*Primary Examiner*—John S. Chu
(74) *Attorney, Agent, or Firm*—Piper Rudnick LLP; Steven B. Kelber

(57) ABSTRACT

A radiation-sensitive resin composition including (A) a resin containing an alicyclic skeleton in its backbone, and (B) a radiation-sensitive acid-generating agent, is provided. This composition is excellent in transparency with respect to radiation and dry etching resistance, and can give a photoresist pattern excellent in adhesion to substrates, sensitivity, resolution, and developability.

38 Claims, No Drawings

RADIATION-SENSITIVE RESIN COMPOSITION

BACKGROUND OF THE INVENTION

1. Field of the Invention

The present invention relates to a radiation-sensitive resin composition, and particularly to a radiation-sensitive resin composition which can be favorably used as a chemically amplified photoresist useful in micro-processing using various radiations, e.g., far-ultraviolet radiation such as KrF excimer laser or ArF excimer laser, X rays such as synchrotron radiation, charged particle radiation such as electron beam, etc.

2. Description of the Prior Art

In the field of micro-processing represented by. fabrication of integrated circuit elemental devices, to realize a higher degree of integration, lithography technology capable of micro-processing on the order of sub-half micron (0.25 $\mu$m or less) is recently under development, and it is expected that micro-processing on the order of sub-quarter micron (0.25 $\mu$m or less) will be required in the near future.

In the conventional lithography processing, near ultraviolet radiation such as i-line and the like are used as radiation. However, it is said to be extremely difficult to realize micro-processing on the order of sub-quarter micron with near ultra-violet radiation.

Thus, to enable micro-processing on the order of sub-quarter micron, the use of radiations with shorter wave lengths is considered. Radiations having such short wave lengths include, for example, a bright line spectrum of mercury lamps, far-ultraviolet radiations represented by excimer lasers, X rays, electron beam, etc. Out of these, KrF excimer laser or ArF excimer laser attracts particular attention.

As a radiation-sensitive resin composition suited for irradiation with excimer lasers, there have been proposed many compositions (hereinafter, referred to as "chemically amplified radiation-sensitive composition") using chemical amplification action effected by a component containing an acid-cleavable functional group and a component which generates an acid upon irradiation with radiation (hereinafter, referred to as "acid-generating agent").

For example, Japanese Patent Publication (kokoku) No. 2-27660 discloses, as one of the chemically amplified radiation-sensitive compositions, a composition comprising a polymer having a t-butyl ester group of a carboxylic acid or a t-butyl carbonate group of a phenol, and an acid-generating agent. This composition uses the phenomenon that the t-butyl ester group or the t-butyl carbonate group present in the polymer cleaves by the catalytic action of an acid generated by irradiation, so that the polymer comes to have acidic groups of carboxyl or phenol group, and the irradiated areas of the photoresist film thereby become readily soluble in alkaline developing solution.

Most of the chemically amplified radiation-sensitive compositions known heretofore, are based on a phenolic resin. The phenolic resin has a drawback that when far ultraviolet radiation is used as radiation, the far ultraviolet radiation is absorbed by aromatic rings in the resin, and therefore the far ultraviolet radiation can not reach the lower portion near the substrate of the photoresist film sufficiently. For this, irradiation dose is larger at the upper portion of the photoresist film but on the other hand it is smaller at the lower portion, resulting in the problem that the photoresist pattern after development forms a tapered resist profile, that is, the width is smaller at the upper portion and become larger at the lower portion. This means that sufficient resolution can not be obtained. It is also a problem that if the developed photoresist pattern is tapered, desired dimensional accuracy can not be achieved at subsequent steps, i.e., at the steps of etching, ion implantation, etc. Furthermore, if the upper portion of the photoresist pattern in section is not rectangular, the rate of loss of the photoresist caused by dry etching is increased, so that the etching conditions can be controlled with difficulty.

The shape of a photoresist pattern in section can be improved by increasing the transmittance of the photoresist film with respect to radiation. For example, since (meth) acrylate resins represented by polymethyl methacrylate have a high transparency with respect to far ultraviolet radiation, they are very favorable resins from the viewpoint of transmittance of radiation. For example, Japanese Laid-open Patent Publication (kokai) No. 4-226461 discloses a chemically amplified radiation-sensitive resin composition using a methacrylate resin. Although this composition is excellent in performance of micro-processing, it has a drawback of poor dry etching resistance because it contains no aromatic rings. Also, in this case, etching processing with high accuracy can be conducted with difficulty.

SUMMARY OF THE INVENTION

It is an object of the present invention to provide a radiation-sensitive resin composition which is particularly excellent in transparency with respect to radiation and dry etching resistance and which can give a photoresist pattern excellent in adhesion to substrates, sensitivity, resolution, developability, etc., as a chemically amplified photoresist sensitive to activated radiations, for example, far ultraviolet radiation represented by KrF excimer laser or Arf excimer laser.

The present invention provides a radiation-sensitive resin composition comprising (A) a resin containing an alicyclic skeleton in the backbone, and (B) a radiation-sensitive acid-generating agent capable of generating an acid upon irradiation.

The radiation-sensitive resin composition of the present invention is, as a chemically amplified photoresist, excellent particularly in transparency for radiation and dry etching resistance, and can form a photoresist pattern excellent in adhesion to substrates, sensitivity, resolution and developability. The composition can be very suitably used in the production of semiconductor devices of which miniaturization will further proceed in the future.

DETAILED DESCRIPTION OF THE PREFERRED EMBODIMENTS

The following terms are herein used to generically have the meaning below.

The term "(cyclo)alkane" includes alkane and cycloalkane, "(cyclo)alkyl" includes alkyl and cycloalkyl, "(cyclo)alkoxy" includes alkoxy and cycloalkoxy, and "(cyclo)acyl" includes acyl and cycloalkylcarbonyl.

The term "(meth)acrylic acid" includes acrylic acid and methacrylic acid, and "(meth)acrylate" includes acrylate and methacrylate.

The term "(co)polymer" includes homopolymer and copolymer, and "(co)polymerization" includes homopolymerization and copolymerization.

The present invention will now be described in detail.

Resin (A)

The alicyclic skeleton contained in the resin comprising an alicyclic skeleton in the backbone (hereinafter, referred to as "resin (A)") may be monocyclic as in the skeletons derived from cycloalkanes or polycyclic as in the skeletons derived from bicyclo[2.2.1]heptane, tetracyclo[4.4.0.1$^{2,5}$.1$^{7,10}$]dodecane or the like. The resin (A) may contain one or more kinds of alicyclic skeletons.

Said alicyclic skeleton may contain at least one group which is cleaved by an acid (hereinafter, referred to as "acid-cleavable group") at any position thereon. The alicyclic skeleton may optionally contain one or more substituents other than the acid-cleavable group, e.g., a halogen atom, a monovalent hydrocarbon group having 1 to 10 carbon atoms, a monovalent halogenated hydrocarbon group having 1 to 10 carbon atoms at any position thereon.

The use of the resin (A) comprising an alicyclic skeleton in the backbone according to the present invention, has been able to provide a radiation-sensitive resin composition which is particularly excellent in transparency with respect to radiation and dry etching resistance, and which can give a photoresist pattern excellent in adhesion to substrates, sensitivity, resolution, developability, etc., as a photoresist.

The resin (A) used in the present invention is preferably a resin which is insoluble or slightly soluble in alkali in itself but which has at least one acid-cleavable group to be cleaved by the catalytic action of an acid and becomes alkali-soluble. The terminology "insoluble or slightly soluble in alkali" herein means that the resin is insoluble or slightly soluble in a developing solution of an alkaline solution used for development of the photoresist film formed from the radiation-sensitive resin composition of the present invention. The solubility of the resin (A) in alkali can be regulated by the content of acidic functional groups such as carboxyl groups.

Preferred alicyclic skeletons in the resin (A) include the skeleton represented by the following general formula (1) and the skeleton represented by the general formula (2), and the skeleton of the general formula (1) is particularly preferred.

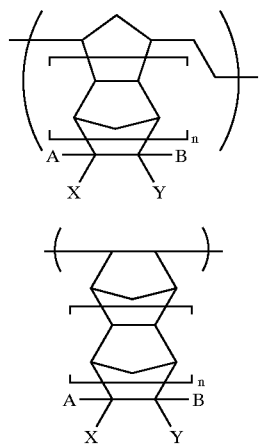

wherein in the general formula (1) and general formula (2), n is 0 or 1, A and B represent independently a hydrogen atom, a halogen atom, a monovalent hydrocarbon group having 1 to 10 carbon atoms or a monovalent halogenated hydrocarbon group having 1 to 10 carbon atoms, and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group.

Preferably, the acid-cleavable group of X and Y in the general formula (1) and general formula (2) is a group: —(CH$_2$)$_i$COOR$^1$, —(CH$_2$)$_i$OCOR$^2$ or —(CH$_2$)$_i$CN wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxyethyl group, a carbobutoxypropyl group or a trialkylsilyl group the alkyl groups of which each have 1 to 4 carbon atoms, R$^2$ represents a hydrocarbon group having 1 to 10 carbon atoms or a halogenated hydrocarbon group having 1 to 10 carbon atoms, and i is an integer of 0 to 4; or X and Y are bonded to each other to form a bivalent group represented by the formula:

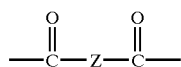

wherein Z is —O— or —N(R$^3$)— in which R$^3$ is a hydrogen atom, a halogen atom, an alkyl group having 1 to 8 carbon atoms or a —SO$_2$R$^4$ group having 1 to 4 carbon atoms in which R$^4$ is an alkyl group having 1 to 4 carbon atoms or a halogenated alkyl group having 1 to 4 carbon atoms, or the formula: —O—, so that X and Y form, jointly with the two carbon atoms which constitute a part of the alicyclic skeleton and to which X and Y are directly bonded, an oxygen-containing or nitrogen-containing heterocyclic structure having the formula:

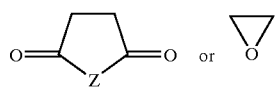

where Z is as defined above.

In the preferable acid-cleavable groups of X and Y in the general formula (1) and general formula (2), the group —(CH$_2$)$_i$COOR$^1$ includes, for example, (cyclo)alkoxycarbonyl groups such as methoxycarbonyl, ethoxycarbonyl, n-propoxycarbonyl, isopropoxycarbonyl, n-butoxycarbonyl, 2-methylpropoxycarbonyl, 1-methylpropoxycarbonyl, t-butoxycarbonyl, n-pentyloxycarbonyl, n-hexyloxycarbonyl, n-heptyloxycarbonyl, n-octyloxycarbonyl, n-decyloxycarbonyl, cyclopentyloxycarbonyl, cyclohexyloxycarbonyl, 4-t-butylcyclohexyloxycarbonyl, cycloheptyloxycarbonyl, and cyclooctyloxycarbonyl groups; aryloxycarbonyl groups such as phenoxycarbonyl, 4-t-butylphenoxycarbonyl, and 1-naphthyloxycarbonyl groups; aralkyloxycarbonyl groups such as benzyloxycarbonyl, and 4-t-butylbenzyloxycarbonyl groups; (cyclo)alkoxycarbonylmethyl groups such as methoxycarbonylmethyl, ethoxycarbonylmethyl, n-propoxycarbonylmethyl, isopropoxycarbonylmethyl, n-butoxycarbonylmethyl, 2-methylpropoxycarbonylmethyl, 1-methylpropoxycarbonylmethyl, t-butoxycarbonylmethyl, cyclohexyloxycarbonylmethyl and 4-t-butylcyclohexyloxycarbonylmethyl groups; aryloxycarbonylmethyl groups such as phenoxycarbonylmethyl and 1-naphthyloxycarbonylmethyl groups; aralkyloxycarbonylmethyl groups such as benzyloxycarbonylmethyl and 4-t-butylbenzyloxycarbonylmethyl groups; (cyclo)alkoxycarbonylethyl groups such as 2-methoxycarbonylethyl, 2-ethoxycarbonylethyl, 2-n-propoxycarbonylethyl, 2-isopropoxycarbonylethyl, 2-n- butoxycarbonylethyl, 2-(2-methylpropoxy)carbonylethyl, 2-(1-methylpropoxy)carbonylethyl, 2-t-butoxycarbonylethyl, 2-cyclohexyloxycarbonylethyl and 2-(4-butylcyclohexyloxycarbonyl)ethyl groups; 2-aryloxycarbonylethyl groups such as 2-phenoxycarbonylethyl and 2-(1-naphthylcarbonyl)ethyl groups; and 2-aralkyloxycarbonylethyl groups such as 2-benzyloxycarbonylethyl and 2-(4-t-butylbenzyloxycarbonyl)ethyl groups.

Among these groups, preferred are groups corresponding to the group —COOR$^1$, more preferred are (cyclo)alkoxycarbonyl groups, and particularly preferred are methoxycarbonyl, ethoxycarbonyl, n-butoxycarbonyl, t-butoxycarbonyl and cyclohexyloxycarbonyl groups.

The group —(CH$_2$)$_i$OCOR$^2$ includes, for example, a (cyclo)acyloxy group such as acetyloxy, propionyloxy, butyryloxy, valeryloxy, caproyloxy, heptanoyloxy, octanoyloxy, nonanoyloxy, decanoyloxy, undecanoyloxy, cyclohexylcarbonyloxy and 4-t-butylcyclohexylcarbonyloxy; an arylcarbonyloxy group such as benzoyloxy, 4-t-butylbenzoyloxy and 1-naphthoyloxy groups; an aralkylcarbonyloxy group such as benzylcarbonyloxy and 4-t-benzylcarbonyloxy; a (cyclo)acyloxymethyl group such as acetyloxycarbonylmethyl, propionyloxycarbonylmethyl, butylyloxycarbonylmethyl, cyclohexylcarbonyloxymethyl and 4-t-butylcyclohexylcarbonyloxymethyl groups; an arylcarbonyloxymethyl group such as benzoyloxymethyl and 1-naphthoyloxymethyl; an aralkylcarbonyloxymethyl group such as benzylcarbonyloxymethyl and 4-t-butylbenzylcarbonyloxymethyl groups; a 2-(cyclo)acyloxyethyl group such as 2-acetyloxyethyl, 2-propionyloxyethyl, 2-butylyloxyethyl, 2-cyclohexylcarbonyloxyethyl and 2-(4-t-butylcyclohexylcarbonyloxy)ethyl groups; a 2-arylcarbonyloxyethyl group such as 2-benzoyloxyethyl and 2-(1-naphthoyloxy)ethyl groups; and 2-aralkylcarbonyloxyethyl group such as 2-benzylcarbonyloxyethyl and 2-(4-t-butylbenzylcarbonyloxy)ethyl groups.

The group —(CH$_2$)$_i$CN includes, for example, cyano, cyanomethyl, 2-cyanoethyl, 2-cyanopropyl, 3-cyanopropyl and 4-cyanobutyl groups.

Further, the halogen atom of A, B, X and Y in the general formulas (1) and general formula (2) includes, for example, F, Cl, Br and I. The monovalent hydrocarbon group having 1 to 10 carbon atoms of A, B, X and Y includes, for example, a (cyclo)alkyl group such as methyl, ethyl, n-propyl, isopropyl, n-butyl, 2-methylpropyl, 1-methylpropyl, t-butyl, n-hexyl, n-octyl, n-decyl, cyclopentyl, cyclohexyl, cycloheptyl and cyclooctyl groups; an aryl group such as phenyl, 4-t-butylphenyl and 1-naphthyl groups; and an aralkyl group such as benzyl and 4-t-butylbenzyl groups. The monovalent halogenated hydrocarbon group having 1 to 10 carbon atoms of A, B, X and Y includes, for example, halogenated derivatives of said monovalent hydrocarbon group having 1 to 10 carbon atoms.

In the resin (A), at least one alicyclic skeleton represented by the general formula (1) and at least one alicyclic skeleton represented by the general formula (2) can be independently present and the alicyclic skeleton represented by the general formula (1) and the alicyclic skeleton represented by the general formula (2) can be present together.

The resin (A) having an alicyclic skeleton selected from the group consisting of the alicyclic skeleton represented by the general formula (1) and the alicyclic skeleton represented by general formula (2), in the backbone [hereinafter, referred to as "resin (AI)"] can be produced by, for example, the following methods (a) to (e):

(a) A method comprising the step of ring-opening polymerizing or copolymerizing at least one norbornene derivative represented by the following general formula (7) [hereinafter, referred to as "norbornene derivative (a)"] and optionally at least one other ring-opening copolymerizable unsaturated alicyclic compound.

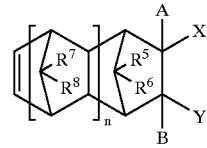

(7)

wherein in the general formula (7), n, A, B, X and Y each have the same meaning as in the general formula (1) and general formula (2), R$^5$, R$^6$, R$^7$ and R$^8$ represent independently a hydrogen atom, a halogen atom, a monovalent hydrocarbon group having 1 to 10 carbon atoms or a monovalent halogenated hydrocarbon group having 1 to 10 carbon atoms.

(b) A method comprising radical copolymerizing at least one norbornene derivative (a) and at least one copolymerizable unsaturated compound such as ethylene or maleic acid anhydride.

(c) A method comprising partially hydrolyzing and/or solvolyzing a resin obtained by said method (a) or (b) in accordance with a conventional procedure.

(d) A method comprising newly incorporating a group of —COOR$^1$ or —OCOR$^2$ (hereinafter, these groups being together generically referred to as "acid-cleavable ester group") into the resin obtained by said method (c) by at least partially esterifying the carboxyl groups or hydroxyl groups contained in said resin in accordance with a conventional procedure.

(e) A method comprising the step of ring-opening (co)polymerizing or radical copolymerizing at least one norbornene derivative [hereinafter, referred to as "norbornene derivative (b)"] represented by the following general formula (8) and at least partially esterifying the carboxyl groups or hydroxyl groups contained in the resulting (co)polymer in accordance with a conventional procedure to introduce an acid-cleavable ester group into the (co)polymer.

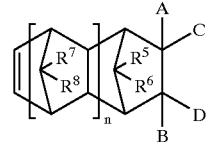

(8)

wherein in the general formula (8), n, A and B each have the same meaning as in the general formula (1) and general formula (2), R$^5$, R$^6$, R$^7$ and R$^8$ each have the same meaning as in the general formula (7), C and D represent independently a hydrogen atom, a halogen atom, a monovalent hydrocarbon group having 1 to 10 carbon atoms, a monovalent halogenated hydrocarbon group having 1 to 10 carbon atoms, —(CH$_2$)$_i$COOH or —(CH$_2$)$_i$OH wherein i has the same meaning as the i in the acid-cleavable group defined in the general formula (1) and general formula (2), provided that at least one of C and D represents —(CH$_2$)$_i$COOH or —(CH$_2$)$_i$OH.

Additionally, the resin obtained by said method (c), (d) or (e) can be modified by, for example, the following method (f):

(f) A method comprising incorporating other acid-cleavable group into said resin by further esterifying a carboxyl group or hydroxyl group contained in the resin.

The methods (a) to (f) are now described in order.

First, in said method (a), the halogen atom, the monovalent hydrocarbon group having 1 to 10 carbon atoms and the monovalent halogenated hydrocarbon group having 1 to 10 carbon atoms, of $R^5$, $R^6$, $R^7$ and $R^8$ in the general formula (7) include, for example, the same groups as those exemplified for said general formula (1) and general formula (2).

Among the norbornene derivatives (a), specific examples of the compound represented by the general formula (7) where n is 0 include:

5-methoxycarbonylbicyclo[2.2.1]hept-2-ene,
5-ethoxycarbonylbicyclo[2.2.1]hept-2-ene,
5-n-propoxycarbonylbicyclo[2.2.1]hept-2-ene,
5-isopropoxycarbonylbicyclo[2.2.1]hept-2-ene,
5-n-butoxycarbonylbicyclo[2.2.1]hept-2-ene,
5-(2-methylpropoxy)carbonylbicyclo[2.2.1]hept-2-ene,
5-(1-methylpropoxy)carbonylbicyclo[2.2.1]hept-2-ene,
5-t-butoxycarbonylbicyclo[2.2.1]hept-2-ene,
5-cyclohexyloxycarbonylbicyclo[2.2.1]hept-2-ene,
5-(4'-t-butylcyclohexyloxy)carbonylbicyclo[2.2.1]hept-2-ene,
5-phenoxycarbonylbicyclo[2.2.1]hept-2-ene,
5-tetrahydrofuranyloxycarbonylbicyclo[2.2.1]hept-2-ene,
5-tetrahydropyranyloxycarbonylbicyclo[2.2.1]hept-2-ene,
5-acetyloxybicyclo[2.2.1]hept-2-ene,
5-cyanobicyclo[2.2.1]hept-2-ene,
5-methyl-5-methoxycarbonylbicyclo[2.2.1]hept-2-ene,
5-methyl-5-ethoxycarbonylbicyclo[2.2.1]hept-2-ene,
5-methyl-5-n-propoxycarbonylbicyclo[2.2.1]hept-2-ene,
5-methyl-5-isopropoxycarbonylbicyclo[2.2.1]hept-2-ene,
5-methyl-5-n-butoxycarbonylbicyclo[2.2.1]hept-2-ene,
5-methyl-5-(2-methylpropoxy)carbonylbicyclo[2.2.1]hept-2-ene,
5-methyl-5-(1-methylpropoxy)carbonylbicyclo[2.2.1]hept-2-ene,
5-methyl-5-t-butoxycarbonylbicyclo[2.2.1]hept-2-ene,
5-methyl-5-cyclohexyloxycarbonylbicyclo[2.2.1]hept-2-ene,
5-methyl-5-(4'-t-butylcyclohexyloxy)carbonylbicyclo[2.2.1]hept-2-ene,
5-methyl-5-phenoxycarbonylbicyclo[2.2.1]hept-2-ene,
5-methyl-5-tetrahydrofuranyloxycarbonylbicyclo[2.2.1]hept-2-ene,
5-methyl-5-tetrahydropyranyloxycarbonylbicyclo[2.2.1]hept-2-ene,
5-methyl-5-acetyloxybicyclo[2.2.1]hept-2-ene,
5-methyl-5-cyanobicyclo[2.2.1]hept-2-ene,
5,6-di(methoxycarbonyl)bicyclo[2.2.1]hept-2-ene
5,6-di(ethoxycarbonyl)bicyclo[2.2.1]hept-2-ene,
5,6-di(n-propoxycarbonyl)bicyclo[2.2.1]hept-2-ene,
5,6-di(isopropoxycarbonyl)bicyclo[2.2.1]hept-2-ene,
5,6-di(n-butoxycarbonyl)bicyclo[2.2.1]hept-2-ene,
5,6-di(t-butoxycarbonyl)bicyclo[2.2.1]hept-2-ene,
5,6-di(phenoxycarbonyl)bicyclo[2.2.1]hept-2-ene,
5,6-di(tetrahydrofuranyloxycarbonyl)bicyclo[2.2.1]hept-2-ene,
5,6-di(tetrahydropyranyloxycarbonyl)bicyclo[2.2.1]hept-2-ene, and
5,6-dicarboxyanhydridebicyclo[2.2.1]hept-2-ene.

Among the norbornene derivatives (a), specific examples of the compound represented by the general formula (7) where n is 1 include:

8-methoxycarbonyltetracyclo[$4.4.0.1^{2,5}.1^{7,10}$]dodec-3-ene,
8-ethoxycarbonyltetracyclo[$4.4.0.1^{2,5}.1^{7,10}$]dodec-3-ene,
8-n-propoxycarbonyltetracyclo[$4.4.0.1^{2,5}.1^{7,10}$]dodec-3-ene,
8-isopropoxycarbonyltetracyclo[$4.4.0.1^{2,5}1.1^{7,10}$]dodec-3-ene,
8-n-butoxycarbonyltetracyclo[$4.4.0.1^{2,5}.1^{7,10}$]dodec-3-ene,
8-(2-methylpropoxy)carbonyltetracyclo[$4.4.0.1^{2,5}.1^{7,10}$]dodec-3-ene,
8-(1-methylpropoxy)carbonyltetracyclo[$4.4.0.1^{2,5}.1^{7,10}$]dodec-3-ene,
8-t-butoxycarbonyltetracyclo[$4.4.0.1^{2,5}.1^{7,10}$]dodec-3-ene,
8-cyclohexyloxycarbonyltetracyclo[$4.4.0.1^{2,5}.1^{7,10}$]dodec-3-ene,
8-(4'-t-butylcyclohexyloxy)carbonyltetracyclo[$4.4.0.1^{2,5}.1^{7,10}$]dodec-3-ene,
8-phenoxycarbonyltetracyclo[$4.4.0.1^{2,5}.1^{7,10}$]dodec-3-ene,
8-tetrahydrofuranyloxycarbonyltetracyclo[$4.4.0.1^{2,5}.1^{7,10}$]-3-dodecene,
8-tetrahydropyranyloxycarbonyltetracyclo[$4.4.0.1^{2,5}.1^{7,10}$]-3-dodecene,
8-acetyloxytetracyclo[$4.4.0.1^{2,5}.1^{7,10}$]dodec-3-ene,
8-cyanotracyclo[$4.4.0.1^{2,5}.1^{7,10}$]dodec-3-ene,
8-methyl-8-methoxycarbonyltetracyclo[$4.4.0.1^{2,5}.1^{7,10}$]dodec-3-ene,
8-methyl-8-ethoxycarbonyltetracyclo[$4.4.0.1^{2,5}.1^{7,10}$]dodec-3-ene,
8-methyl-8-n-propoxycarbonyltetracyclo[$4.4.0.1^{2,5}.1^{7,10}$]dodec-3-ene,
8-methyl-8-isopropoxycarbonyltetracyclo[$4.4.0.1^{2,5}.1^{7,10}$]dodec-3-ene,
8-methyl-8-n-butoxycarbonyltetracyclo[$4.4.0.1^{2,5}.1^{7,10}$]dodec-3-ene,
8-methyl-8-(2-methylpropoxy)carbonyltetracyclo[$4.4.0.1^{2,5}.1^{7,10}$]dodec-3-ene,
8-methyl-8-(1-methylpropoxy)carbonyltetracyclo[$4.4.0.1^{2,5}.1^{7,10}$]dodec-3-ene,
8-methyl-8-t-butoxycarbonyltetracyclo[$4.4.0.1^{2,5}.1^{7,10}$]dodec-3-ene,
8-methyl-8-cyclohexyloxycarbonyltetracyclo[$4.4.0.1^{2,5}.1^{7,10}$]dodec-3-ene,
8-methyl-8-(4'-t-butylcyclohexyloxy)carbonyltetracyclo[$4.4.0.1^{2,5}.1^{7,10}$]dodec-3-ene,
8-methyl-8-phenoxycarbonyltetracyclo[$4.4.0.1^{2,5}.1^{7,10}$]dodec-3-ene,
8-methyl-8-tetrahydrofuranyloxycarbonyltetracyclo[$4.4.0.1^{2,5}.1^{7,10}$]dodecene,
8-methyl-8-tetrahydropyranyloxycarbonyltetracyclo[$4.4.0.1^{2,5}.1^{7,10}$]-3-dodecene, 8-methyl-8-acetyloxytetracyclo[4.4.0.1$^{2,5}$.1$^{7,10}$]dodec-3-ene, 8-methyl-8-cyanotetracyclo[4.4.0.1$^{2,5}$.1$^{7,10}$]dodec-3-ene, 8,9-di(methoxycarbonyl)tetracyclo[4.4.0.1$^{2,5}$.1$^{7,10}$]dodec-3-ene, 8,9-di(ethoxycarbonyl)tetracyclo[4.4.0.1$^{2,5}$.1$^{7,10}$]dodec-3-ene, 8,9-di(n-propoxycarbonyl)tetracyclo[4.4.0.1$^{2,5}$.1$^{7,10}$]dodec-3-ene, 8,9-di(isopropoxycarbonyl)tetracyclo[4.4.0.1$^{2,5}$.1$^{7,10}$]dodec-3-ene, 8,9-di(n-butoxycarbonyl)tetracyclo[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene, 8,9-di(cyclohexyloxycarbonyl)tetracyclo[4.4.0.1$^{2,5}$.1$^{7,10}$]dodec-3-ene, 8,9-di(phenoxycarbonyl)tetracyclo[4.4.0.1$^{2,5}$.1$^{7,10}$]dodec-3-ene, 8,9-di(tetrahydrofuranyloxycarbonyl)tetracyclo[4.4.0.1$^{2,5}$.1$^{7,10}$]3-dodecene, 8,9-di(tetrahydropyranyloxycarbonyl)tetracyclo[4.4.0.1$^{2,5}$.1$^{7,10}$]-3-dodecene, and 8,9-dicarboxyanhydridetetracyclo[4.4.0.1$^{2,5}$.1$^{7,10}$]dodec-3-ene.

In the present invention, when two or more of said norbornene derivatives (a) are mixed for use, it is preferred that the compound represented by the general formula (7) where n is 0 and the compound represented by the same formula where n is 1 are used in combination.

Specific examples of the other unsaturated alicyclic compounds capable of ring-opening copolymerizing with the norbornene derivatives (a) include:

bicyclo[2.2.1]hept-2-ene, bicyclo[2.2.1]hept-2-ene-5-carboxylic acid, 5-methylbicyclo[2.2.1]hept-2-ene-5-carboxylic acid, 5-methylbicyclo[2.2.1]hept-2-ene, 5-ethylbicyclo[2.2.1]hept-2-ene, tetracyclo[4.4.0.1$^{2,5}$.1$^{7,10}$]dodec-3-ene, tetracyclo[4.4.0.1$^{2,5}$.1$^{7,10}$]dodec-3-ene-8-carboxylic acid, 8-methyltetracyclo[4.4.0.1$^{2,5}$.1$^{17,10}$]dodec-3-ene-8-carboxylic acid, 8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene, 8-fluorotetracyclo[4.4.0.1$^{2,5}$.1$^{7,10}$]dodec-3-ene, 8-fluoromethyltetracyclo[4.4.0.1$^{2,5}$.1$^{7,10}$]dodec-3-ene, 8-difluoromethyltetracyclo[4.4.0.1$^{2,5}$.1$^{7,10}$]dodec-3-ene, 8-trifluoromethyltetracyclo[4.4.0.1$^{2,5}$.1$^{7,10}$]dodec-3-ene 8-pentafluoroethyltetracyclo[4.4.0.1$^{2,5}$.1$^{7,10}$]dodec-3-ene, 8,8-difluorotetracyclo[4.4.0.1$^{2,5}$.1$^{7,10}$]dodec-3-ene, 8,9-difluorotetracyclo[4.4.0.1$^{2,5}$.1$^{7,10}$]dodec-3-ene, 8,8-bis(trifluoromethyl)tetracyclo[4.4.0.1$^{2,5}$.1$^{7,10}$]dodec-3-ene, 8,9-bis(trifluoromethyl)tetracyclo[4.4.0.1$^{2,5}$.1$^{7,10}$]dodec-3-ene, 8-methyl-8-trifluoromethyltetracyclo[4.4.0.1$^{2,5}$.1$^{7,10}$]dodec-3-ene, 8,8,9-trifluorotetracyclo[4.4.0.1$^{2,5}$.1$^{7,10}$]dodec-3-ene, 8,8,9-tris(trifluoromethyl)tetracyclo[4.4.0.1$^{2,5}$.1$^{7,10}$]dodec-3-ene, 8,8,9,9-tetrafluorotetracyclo[4.4.0.1$^{2,5}$.1$^{7,10}$]dodec-3-ene, 8,8,9,9-tetrakis(trifluoromethyl)tetracyclo[4.4.0.1$^{2,5}$.1$^{7,10}$]dodec-3-ene, 8,8-difluoro-9,9-bis(trifluoromethyl)tetracyclo[4.4.0.1$^{2,5}$.1$^{7,10}$]dodec-3-ene, 8,9-difluoro-8,9-bis(trifluoromethyl)tetracyclo[4.4.0.1$^{2,5}$.1$^{7,10}$]dodec-3-ene, 8,8,9-trifluoro-9-trifluoromethyltetracyclo[4.4.0.1$^{2,5}$.1$^{7,10}$]dodec-3-ene, 8,8,9-trifluoro-9-trifluoromethoxytetracyclo[4.4.0.1$^{2,5}$.1$^{7,10}$]dodec-3-ene, 8,8,9-trifluoro-9-pentafluoropropoxytetracyclo[4.4.0.1$^{2,5}$.1$^{7,10}$]dodec-3-ene, 8-fluoro-8-pentafluoroethyl-9,9-bis(trifluoromethyl)tetracyclo[4.4.0.1$^{2,5}$.1$^{7,10}$]dodec-3-ene, 8,9-difluoro-8-heptafluoroisopropyl-9-trifluoromethyltetracyclo[4.4.0.1$^{2,5}$.1$^{7,10}$]dodec-3-ene, 8-chloro-8,9,9-trifluorotetracyclo[4.4.0.1$^{2,5}$.1$^{7,10}$]dodec-3-ene, 8,9-dichloro-8,9-bis(trifluoromethyl)tetracyclo[4.4.0.1$^{2,5}$.1$^{7,10}$]dodec-3-ene, 8-(2,2,2-trifluorocarboxyethyl)tetracyclo[4.4.0.1$^{2,5}$.1$^{7,10}$]dodec-3-ene, 8-methyl-8-(2,2,2-trifluorocarboxyethyl)tetracyclo[4.4.0.1$^{2,5}$.1$^{7,10}$]dodec-3-ene, cyclobutene, cyclopentene, cyclooctene, 1,5-cyclooctadiene, 1,5,9-cyclododecatriene, norbornene, 5-ethylidenenorbornene, 5-methylnorbornene, dicyclopentadiene, tricyclo[5.2.1.0$^{2,6}$]deca-8-ene, tricyclo[5.2.1.0$^{2,6}$]deca-3-ene, tricyclo[4.4.0.1$^{2,5}$]undeca-3-ene, tricyclo[6.2.1.0$^{1,8}$]undeca-9-ene, tricyclo[6.2.1.0$^{1,8}$]undeca-4-ene, tetracyclo[4.4.0.1$^{2,5}$.1$^{7,10}$.0$^{1,6}$]dodec-3-ene, 8-methyltetracyclo[4.4.0.1$^{2,5}$.1$^{7,10}$.0$^{1,6}$]dodec-3-ene, 8-ethylidenetetracyclo[4.4.0.1$^{2,5}$.1$^{2,5}$.1$^{7,10}$.1$^{7,12}$]dodec-3-ene, 8-ethylidenetetracyclo[4.4.0.1$^{2,5}$.1$^{7,10}$.0$^{1,6}$]dodec-3-ene, pentacyclo[6.5.1.1$^{3,6}$.0$^{2,7}$.0$^{9,13}$]pentadeca-4-ene, and pentacyclo[7.4.0.1$^{2,5}$.1$^{9,12}$.0$^{8,13}$]pentadeca-3-ene.

In the resin (AI), the content of the structural units derived from said other unsaturated alicyclic compound is generally 50 mole % or less, preferably 40 mole % or less, and more preferably 30 mole % or less, based on the total structural units contained in the resin (AI). If the content of the structural units derived from the other unsaturated alicyclic compound is more than 50 mole %, dry etching resistance may tend to lower.

The ring-opening (co)polymerization in the method (a) can be carried out, for example, using a metathesis catalyst in a suitable solvent.

The metathesis catalyst is comprised of generally a combination of at least one compound selected from the group consisting of W, Mo and Re compounds (hereinafter, referred to as "specified transition metal compound") with at least one compound, selected from the group consisting of the compounds of the metals of Group IA, IIA, IIIA, IVA and IVB in the Deming's periodic table, the compounds having metal-carbon bonding and/or metal-hydrogen bonding (hereinafter, referred to as "specified organometallic compound").

The specified transition metal compound includes, for example, halides, oxyhalides, alkoxyhalides, alkoxides, carboxylic acid salts, (oxy)acetylacetonates, carbonyl complexes, acetonitrile complexes, hydride complexes, and their derivatives. Among these compounds, preferred are W compounds or Mo compounds, more specifically halides, oxyhalides or alkoxyhalides of W or of Mo, from the viewpoint of polymerization activity, practical use, etc.

The specified transition metal compound may be a compound coordinated with a suitable complexing agent such as triphenylphosphine ($P(C_6H_5)_3$) and pyridine ($NC_5H_5$).

Specific examples of the specified transition metal compound include $WCl_6$, $WCl_5$, $WCl_4$, $WBr_6$, $WF_6$, $WI_6$, $MoCl_5$, $MoCl_4$, $MoCl_3$, $ReCl_3$, $WOCl_4$, $WOCl_3$, $WOBr_3$, $MoOCl_3$, $MoOBr_3$, $ReOCl_3$, $ReOBr_3$, $WCl_2(OC_2H_5)_4$, $W(OC_2H_5)_6$, $MoCl_3(OC_2H_5)_2$, $Mo(OC_2H_5)_5$, $WO_2(acac)_2$ wherein acac stands for an acetylacetonate radical, $MoO_2(acac)_2$, $W(OCOR)_5$ wherein OCOR stands for a carboxylic acid radical, $Mo(OCOR)_5$, $W(CO)_6$, $Mo(CO)_6$, $Re_2(CO)_{10}$, $WCl_5.P(C6H_5)_3$, $MoCl_5.P(C_6H_5)_3$, $ReOBr_3.P(C_6H_5)_3$, $WCl_6.NC_5H_5$, $W(CO)_5.P(C_6H_5)_3$, and $W(CO)_3.(CH_3CN)_3$.

Among them, particularly preferred are $WCl_6$, $MoCl_5$, $WCl_2(OC_2H_5)_4$ and $MoCl_3(OC_2H_5)_2$.

Said specified transition metal compound can be used singly or in a combination of two or more thereof.

The specified transition metal compound component constituting a metathesis catalyst can be also used as a mixture of two or more compounds reacting in a polymerization system to form the specified transition metal compound.

Specific examples of the specified organometallic compound include $n-C_4H_9Li$, $n-C_5H_{11}Na$, $n-C_6H_5Na$, $CH_3MgI$, $C_2H_5MgBr$, $CH_3MgBr$, $n-C_3H_7MgCl$, $t-C_4H_9MgCl$, $CH_2=CHCH_2MgCl$, $(C_2H_5)_2Zn$, $(C_2H_5)_2Cd$, $CaZn(C_2H_5)_4$, $(CH_3)_3B$, $(C_2H_5)_3B$, $(n-C_4H_9)_3B$, $(CH_3)_3Al$, $(CH_3)_2AlCl$, $CH_3AlCl_2$, $(CH_3)_3Al_2Cl_3$, $(C_2H_5)_3Al$, $(C_2H_5)_3Al_2Cl_3$, $(C_2H_5)_2Al.O(C_2H_5)_2$, $(C_2H_5)_2AlCl$, $C_2H_5AlCl_2$, $(C_2H_5)_2AlH$, $(C_2H_5)_2AlOC_2H_5$, $(C_2H_5)_2AlCN$, $LiAl(C_2H_5)_2$, $(n-C_3H_7)_3Al$, $(i-C_4H_9)_3Al$, $(i-C_4H_9)_2AlH$, $(n-C_6H_{13})_3Al$, $(n-C_8H_{17})_3Al$, $(C_6H_5)_3Al$, $(CH_3)_4Ga$, $(CH_3)_4Sn$, $(n-C_4H_9)_4Sn$, $(C_2H_5)_3SnH$, $LiH$, $NaH$, $B_2H_6$, $NaBH_4$, $AlH_3$, $LiAlH_4$ and $TiH_4$.

Among these compounds, preferred are $(CH_3)_3Al$, $(CH_3)_2AlCl$, $CH_3AlCl_2$, $(CH_3)_3Al_2Cl_3$, $(C_2H_5)_3Al$, $(C_2H_5)_2AlCl$, $C_2H_5AlCl_2$, $(C_2H_5)_3Al_2Cl_3$, $(C_2H_5)_2AlH$, $(C_2H_5)_2AlOC_2H_5$, $(C_2H_5)_2AlCN$, $(n-C_3H_7)_3Al$, $(i-C_4H_9)_3Al$, $(i-C_4H_9)_2AlH$, $(n-C_6H_{13})_3Al$, $(n-C_8H_{17})_3Al$, and $(C_6H_5)_3Al$.

Said specified organometallic compound can be used singly or in a combination of two or more thereof.

With regard to the quantitative relation between the specified transition metal compound and the specified organometallic compound, the specified transition metal compound/the specified organometallic compound is in the range of generally from 1/1 to 1/100, and preferably from 1/2 to 1/50, in terms of metal atomic ratio.

In order to enhance catalytic activity, one or more of the following activating agents ① to ⑨ can be added to said catalyst consisting of a combination of said specified transition metal compound and said specified organometallic compound.

Activating Agent ①:
Boron compounds such as B, $BF_3$, $BCl_3$, $B(O-n-C_4H_9)_3$, $BF_3.O(CH_3)_2$, $BF_3.O(C_2H_5)_2$, $BF_3.O(n-C_4H_9)_2$, $BF_3.2C_6H_5OH$, $BF_3.2CH_3COOH$, $BF_3.CO(NH_2)_2$, $BF_3.N(C_2H_4OH)_3$, $BF_3$.piperidine, $BF_3.NH_2C_2H_5$, $B_2O_3$ and $H_3BO_3$; and silicon compounds such as $Si(OC_2H_5)_4$ and $SiCl_4$.

Activating Agent ②:
Alcohols, hydroperoxides, dialkylperoxides and diecylperoxides.

Activating Agent ③:
Water

Activating Agent ④:
Oxygen

Activating Agent ⑤:
Carbonyl compounds such as aldehydes and ketones; and their oligomers or polymers.

Activating Agent ⑥:
Cyclic ethers such as ethylene oxide, epichlorohydrin and oxetane.

Activating Agent ⑦:
Amides such as N,N-dimethylformamide and N,N-dimethylacetamide; amines such as aniline, morpholine and piperidine; and azo compounds such as azobenzene.

Activating Agent ⑧:
N-Nitroso compounds such as N-nitrosodimethylamine and N-nitrosodiphenylamine.

Activating Agent ⑨:
Compounds having nitrogen-chlorine bonding or sulfur-chlorine bonding, such as trichloromelamine, N-chlorosuccinimide and phenylsulfenyl chloride.

The quantitative relation between these activating agents and the specified transition metal compound can not be unconditionally determined since the relation changes in a very wide variety depending on the kind of the activating agent to be used. However, in many cases, the activating agent/the specified transition metal compound is in the range of generally from 0.005/1 to 10/1, and preferably from 0.05/1 to 3.0/1, in terms of molar ratio.

The average molecular weight of the resin (AI) obtained by the ring-opening (co)polymerization in the method (a) can be adjusted by changing the reaction conditions such as the kind and concentration of the metathesis catalyst, the polymerization temperature, the kind and amount of a solvent, and the concentration of a monomer. However, it is preferred that the average molecular weight is adjusted by adding a suitable molecular weight modifier in a suitable amount to the reaction system.

Said molecular weight modifier includes, for example, α-olefins such as ethylene, propylene, 1-butene, 1-pentene, 1-hexene, 1-heptene, 1-octene, 1-nonene and 1-decene; α,ω-diolefins such as 1,3-butadiene and 1,4-pentadiene; vinyl aromatic compounds such as styrene and α-methylstyrene; acetylenes; and polar allyl compounds such as allyl chloride, allyl acetate and trimethylallyloxysilane.

These molecular weight modifiers can be used singly or in a combination of two or more thereof.

The amount of the molecular weight modifier used is generally 0.005 to 2 moles, preferably 0.02 to 1.0 mole, and more preferably 0.03 to 0.7 mole, per mole of the whole monomer.

Further, the solvent used in the method (a) includes, for example, alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutane, bromohexane, dichloroethane, hexamethylene dibromide and chlorobenzene; and saturated carboxylic acid esters such as ethyl acetate, n-butyl acetate, i-butyl acetate and methyl propionate.

These solvents can be used singly or in a combination of two or more thereof.

The radical copolymerization in the method (b) can be carried out, for example, using a radical polymerization catalyst, such as hydroperoxides, dialkylperoxides, diacylperoxides and azo compounds, in a suitable solvent.

The solvent used in the method (b) includes, for example, those exemplified in said method (a) and, in addition thereto, tetrahydrofuran and the like. These solvents can be used singly or in a combination of two or more thereof.

The degree of hydrolysis in said method (c) generally ranges from 10 to 100 mole %, preferably 20 to 95 mole %.

The degree of introduction of the acid-cleavable ester group according to said method (d) generally ranges from 10 to 70 mole %, preferably 20 to 60 mole %.

In the method (e), the halogen atom, the monovalent hydrocarbon group having 1 to 10 carbon atoms, and the monovalent halogenated hydrocarbon group having 1 to 10 carbon atoms, of C and D in the general formula (8) include, for example, the same groups as those exemplified for said general formula (1) and general formula (2).

The norbornene derivatives (b) include the compounds exemplified for said norbornene derivatives (a) in which the ester group therein has been converted into a carboxyl group or a hydroxyl group.

In the present invention, when two or more of said norbornene derivatives (b) are mixed for use, it is also preferred that the compound represented by the general formula (8) where n is 0 and the compound represented by the same formula where n is 1 are used in combination.

The (co)polymer used in the method (e) can be obtained by hydrolyzing the resin (AI) obtained by said method (a) or (b), or may be synthesized by another method.

The degree of introduction of the acid-cleavable ester group according to said method (e) generally ranges from 10 to 70 mole %, preferably 20 to 60 mole %.

In said method (f), the other acid-cleavable group includes, for example, a linear acetal group such as methoxymethyloxy, ethoxymethyloxy, n-propoxymethyloxy, isopropoxymethyloxy, n-butoxymethyloxy, t-butoxymethyloxy, phenoxymethyloxy and trichloroethoxymethyloxy groups; a cyclic acetal group such as tetrahydrofuranyloxy and tetrahydropyranyloxy; a carbonate group such as isopropoxycarbonyloxy, 2-butenyloxycarbonyloxy, t-butoxycarbonyloxy, 1-methyl-2-propenyloxycarbonyloxy, cyclohexyloxycarbonyloxy and 2-cyclohexenyloxycarbonyloxy groups; an orthocarbonate group such as trimethoxymethyloxy, triethoxymethyloxy, tri-n-propoxymethyloxy and methoxydiethoxymethyloxy; a (cyclo)alkyl ether such as methyl ether, ethyl ether, n-propyl ether, isopropyl ether, n-butyl ether, 2-methylpropyl ether, 1-methylpropyl ether, t-butyl ether, cyclohexyl ether and t-butylcyclohexyl ether groups; an alkenyl ether such as allyl ether, 2-butenyl ether, 2-cyclohexenyl ether and 1-methyl-2-propenyl ether groups; an aralkyl ether such as benzyl ether and t-butyl benzyl ether groups; and an enol ether such as vinyl ether, 1-propenyl ether, 1-butenyl ether, 1,3-butadienyl ether and phenylvinyl ether.

Examples of the introduction reaction of the other acid-cleavable group according to the method (f) include the following:
(f-1) an esterification reaction based on the addition reaction of the carboxyl group contained in each resin with 2,3-dihydro-4H-pyran,
(f-2) an etherification reaction based on the addition reaction of the hydroxyl group contained in each resin with 2,3-dihydro-4H-pyran, and
(f-3) an esterification reaction based on the reaction of the hydroxyl group contained in each resin with a dialkyl dicarbonate.

The degree of introduction of the other acid-cleavable group according to said method (f) generally ranges from 10 to 70 mole %, preferably 20 to 60 mole %.

The resin (A) in the present invention preferably contains a small amount of carbon-carbon unsaturated bonding from the viewpoint of transparency to radiation. The resin (A) like this can be obtained, for example, by effecting addition reaction such as hydrogenation, hydration, addition of a halogen, or addition of a hydrogen halide either in a suitable step in the ring-opening (co)polymerization method according to said method (a) or said method (e), or after the method (a) or (e). Particularly, the resin (AI) obtained by effecting hydrogenation reaction is preferred. The resin (AI) obtained by said method (b) or the radical (co)polymerization method according to said method (e) has substantially no carbon-carbon unsaturated bonding.

The degree of hydrogenation in the hydrogenated resin (AI) is preferably 70% or more, more preferably 90% or more, and particularly preferably 100%.

The catalysts used in said hydrogenation reaction include those which have been used in the conventional hydrogenation reaction of olefinic compounds.

Among these hydrogenation catalysts, heterogeneous catalysts include, for example, a solid catalyst comprising a noble metal, such as Pd, Pt, Ni, Rh and Ru, supported on a carrier, such as carbon, silica, alumina and titania. These heterogeneous catalysts can be used singly or in combination of two or more thereof.

On the other hand, homogeneous catalysts include a nickel naphthenenate/triethylaluminum system, a nickel acetylacetonate/triethylaluminum system, a cobalt octenoate/n-butyllithium system, a titanocene dichloride/diethylaluminum monochloride system, and a rhodium system such as rhodium acetate and chlorotris (triphenylphosphine)rhodium. These homogeneous catalysts can be used singly or in combination of two or more thereof.

Among said hydrogenation catalysts, the heterogeneous catalysts are preferred from the viewpoint of their high reaction activity, their easy removal after the reaction, and a superior color tone of the resulting resin (AI).

The hydrogenation reaction can be carried out at generally 0 to 200° C., and preferably 20 to 180° C., in a hydrogen gas atomsphere having generally normal pressure to 300 atm, and preferably 3 to 200 atm.

Preferable resin (AI) in the present invention includes particularly the following resin (AII), resin (AIII) and resin (AIV).

The resin (AII) is a resin comprising a structural unit represented by the following general formula (3):

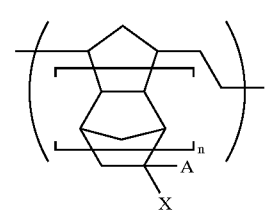

(3)

wherein in the general formula (3), n is 0 or 1, A represents a hydrogen atom, a halogen atom, a monovalent hydrocarbon group having 1 to 10 carbon atoms or a monovalent halogenated hydrocarbon group having 1 to 10 carbon atoms, and X represents an acid-cleavable group.

In the general formula (3), the halogen atom, the monovalent hydrocarbon group having 1 to 10 carbon atoms or the monovalent halogenated hydrocarbon group having 1 to 10 carbon atoms of A, and the acid-cleavable group of X include, for example, the same groups as those exemplified for said general formula (1) and general formula (2).

The resin (AII) preferably contains as the acid-cleavable group of X the group —$(CH_2)_i COOR^1$ described as the acid-cleavable group in the general formula (1) and general formula (2), more preferably contains as the acid-cleavable group of X the group —COOR$^1$, and particularly preferably contains as the acid-cleavable group of X a (cyclo) alkoxycarbonyl group such as methoxycarbonyl, ethoxycarbonyl, n-propoxycarbonyl, isopropoxycarbonyl, n-butoxycarbonyl, 2-methylpropoxycarbonyl, 1-methylpropoxycarbonyl, t-butoxycarbonyl, n-pentyloxycarbonyl, n-hexyloxycarbonyl, n-heptyloxycarbonyl, n-octyloxycarbonyl, n-decyloxycarbonyl, cyclopentyloxycarbonyl, cyclohexyloxycarbonyl, 4-t-butylcyclohexyloxycarbonyl, cycloheptyloxycarbonyl and cyclooctyloxycarbonyl groups; an aryloxycarbonyl group such as phenoxycarbonyl, 4-t-butylphenoxycarbonyl and 1-naphthyloxycarbonyl groups; and an aralkyloxycarbonyl group such as benzyloxycarbonyl and 4-t-butylbenzyloxycarbonyl.

A more specific typical example of the structural unit of the general formula (3) is represented by the formula (3-1):

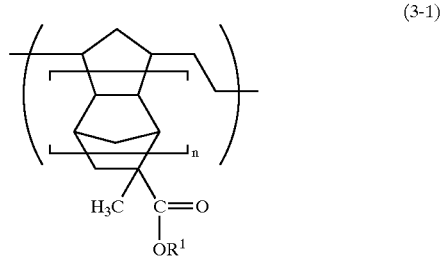

(3-1)

wherein n is 0 or 1, and R$^1$ is as defined above.

In said resin (AII), one or more structural units represented by the general formula (3) can be present.

The resin (AIII) is a random copolymer comprising a structural unit represented by the following general formula (3) and a structural unit represented by the following general formula (4).

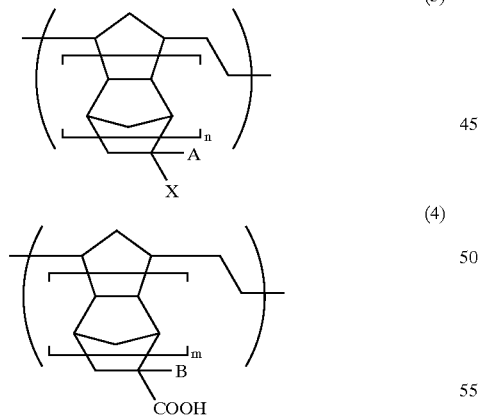

(3)

(4)

wherein in the general formula (3) and general formula (4), n and m are independently 0 or 1, A and B represent independently a hydrogen atom, a halogen atom, a monovalent hydrocarbon group having 1 to 10 carbon atoms or a monovalent halogenated hydrocarbon group having 1 to 10 carbon atoms, and X represents an acid-cleavable group.

In the general formula (3) and general formula (4), the halogen atom, the monovalent hydrocarbon group having 1 to 10 carbon atoms or the monovalent halogenated hydrocarbon group having 1 to 10 carbon atoms of A and B, and the acid-cleavable group of X include, for example, the same groups as those exemplified for said general formula (1) and general formula (2).

The resin (AIII) preferably contains as the acid-cleavable group of X the group —(CH$_2$)$_t$COOR$^1$ described as the acid-cleavable group in the general formula (1) and general formula (2), more preferably contains as the acid-cleavable group of X the group —COOR$^1$, and particularly preferably contains as the acid-cleavable group of X a (cyclo) alkoxycarbonyl group such as methoxycarbonyl, ethoxycarbonyl, n-propoxycarbonyl, isopropoxycarbonyl, n-butoxycarbonyl, 2-methylpropoxycarbonyl, 1-methylpropoxycarbonyl, t-butoxycarbonyl, n-pentyloxycarbonyl, n-hexyloxycarbonyl, n-heptyloxycarbonyl, n-octyloxycarbonyl, n-decyloxycarbonyl, cyclopentyloxycarbonyl, cyclohexyloxycarbonyl, 4-t-butylcyclohexyloxycarbonyl, cycloheptyloxycarbonyl and cyclooctyloxycarbonyl groups; an aryloxycarbonyl group such as phenoxycarbonyl, 4-t-butylphenoxycarbonyl and 1-naphthyloxycarbonyl groups; and an aralkyloxycarbonyl group such as benzyloxycarbonyl and 4-t-butylbenzyloxycarbonyl.

A more specific typical example of the resin (AIII) is comprised of a structural unit of the formula (3-1) above and a structural represented by the formula (4-1):

[Chemical 49]

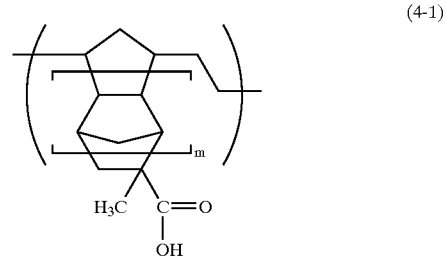

(4-1)

wherein m is 0 or 1.

The molar ratio of the structural unit represented by the general formula (3) to the structural unit represented by the general formula (4) in the resin (AIII) is generally 20/80 to 95/5, and preferably 30/70 to 90/10.

In the resin (AIII), there can be present one or more structural units represented by the general formula (3) and one or more structural units represented by the general formula (4).

The resin (AIV) is a random copolymer containing a structural unit represented by the following general formula (5) and a structural unit represented by the following general formula (6).

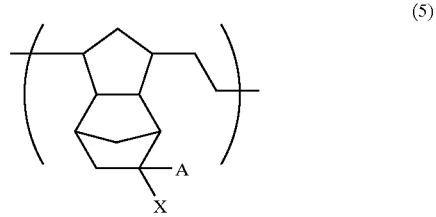

(5)

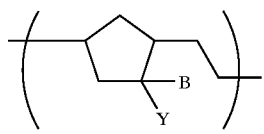

(6)

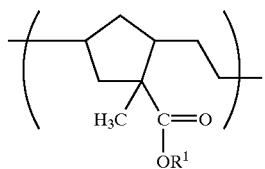

(6-1)

wherein in the general formula (5) and general formula (6), A and B represent independently a hydrogen atom, a halogen atom, a monovalent hydrocarbon group having 1 to 10 carbon atoms or a monovalent halogenated hydrocarbon group having 1 to 10 carbon atoms, and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group.

In the general formula (5) and general formula (6), the halogen atom, the monovalent hydrocarbon group having 1 to 10 carbon atoms or the monovalent halogenated hydrocarbon group having 1 to 10 carbon atoms of A, B, X and Y, and the acid-cleavable group of X and Y include, for example, the same groups as those exemplified for said general formula (1) and general formula (2).

The resin (AIV) preferably contains as the acid-cleavable group of X and Y the group —(CH$_2$)$_i$COOR$^1$ described as the acid-cleavable group in the general formula (1) and general formula (2), more preferably contains as the acid-cleavable group of X and Y the group —COOR$^1$, and particularly preferably contains as the acid-cleavable group of X and Y a (cyclo)alkoxycarbonyl group such as methoxycarbonyl, ethoxycarbonyl, n-propoxycarbonyl, isopropoxycarbonyl, n-butoxycarbonyl, 2-methylpropoxycarbonyl, 1-methylpropoxycarbonyl, t-butoxycarbonyl, n-pentyloxycarbonyl, n-hexyloxycarbonyl, n-heptyloxycarbonyl, n-octyloxycarbonyl, n-decyloxycarbonyl, cyclopentyloxycarbonyl, cyclohexyloxycarbonyl, 4-t-butylcyclohexyloxycarbonyl, cycloheptyloxycarbonyl and cyclooctyloxycarbonyl groups; an aryloxycarbonyl group such as phenoxycarbonyl, 4-t-butylphenoxycarbonyl and 1-naphthyloxycarbonyl groups; and an aralkyloxycarbonyl group such as benzyloxycarbonyl and 4-t-butylbenzyloxycarbonyl.

A more specific typical example of the resin (AIV) is comprised of a structural unit of the formula (5-1) and a structural represented by the formula (6-1):

(5-1)

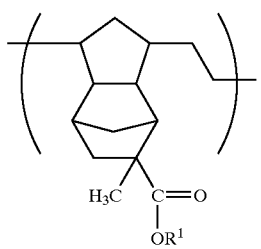

wherein in the general formula (5-1) and general formula (6-1), R$^1$ is independently as defined above.

The molar ratio of the structural unit represented by the general formula (5) to the structural unit represented by the general formula (6) in the resin (AIV) is generally 5/95 to 95/5, and preferably 10/90 to 90/10.

In the resin (AIV), there can be present one or more structural units represented by the general formula (5) and one or more structural units represented by the general formula (6).

The resin (A) in the present invention has a weight average molecular weight in terms of polystyrene, measured by gel permeation chromatography (GPC) (hereinafter referred to as "Mw") of generally 5,000 to 300,000, preferably 5,000 to 200,000, and more preferably 10,000 to 100,000. If the Mw of the resin is less than 5,000, heat resistance as a photoresist may tend to lower. If the Mw is more than 300,000, developability as a photoresist may tend to lower.

The resin (A) in the present invention has a glass transition temperature in the range of preferably 80 to 180° C., and more preferably 90 to 170° C. The glass transition temperature of the resin (A) being in the range of 80 to 180° C. results in obtaining a radiation-sensitive resin composition particularly excellent in heat resistance, sensitivity, etc. as a photoresist.

In the present invention, the resin (A) can be used singly or in combination of two or more thereof.

Further, it is preferred that the resin (A), preferably the resin (AI), and particularly preferably the resin (AII), resin (AIII) and resin (AIV), in the present invention contains impurities in an amount as small as possible. The impurities result mainly from a catalyst used in the production of the resins. Examples of the impurities to be considered particularly from the view point of a photoresist include halogens such as fluorine, chlorine and bromine, and the metals of Group IV, V, VI, VII and VIII in the Deming's periodic table.

It is preferred that the amount of the residual halogen contained in the resin is 3 ppm or less, particularly 2 ppm or less, and that the amount of the residual metal contained is 300 ppb or less, particularly 100 ppb or less. Furthermore, it is preferred that the amount of the residual halogen contained is 3 ppm or less, particularly 2 ppm or less, and that the amount of the residual metal contained is 300 ppb or less, particularly 100 ppb or less. The control of the amounts of the impurities contained to said values or less results in a further improvement in yield when a semiconductor is produced using the radiation-sensitive resin composition of the present invention as well as in sensitivity, resolution and process-stability, as a photoresist.

Methods for reducing the impurities contained in the resin, in the case of the residual halogen, include methods, for example, (a) washing or liquid-liquid extraction of a resin solution with pure water, (b) a combination of washing or liquid-liquid extraction of a resin solution with pure water, and a physical purification process such as ultrafiltration or centrifugal separation, (c) a method using an alkaline aqueous solution or an acidic aqueous solution instead of pure water in the above methods. In case of the residual metal, in addition to the same methods as said methods (a) to (c), (d) a method treating a resin by oxidation, reduction, exchange of ligand, exchange of ion pair or the like to remarkably increase solubility of the residual metal contained in the resin in a solvent or in water, followed by treating according to said methods (a) to (c).

The treatment for reducing the impurities can be carried out in any step after the polymerization step for producing the resin.

(B) Acid-generating Agent

The radiation-sensitive acid-generating agent (hereinafter, referred to as "acid-generating agent (B)") generating an acid upon irradiation with radiation (hereinafter, referred to as "exposure") used in the present invention has a function of cleaving an acid-cleavable group present in the resin (A) and/or an acid-cleavable additive as described later by the action of an acid generated by the exposure, whereby the exposed portion of a photoresist film become readily soluble in an alkaline developing solution and a positive photoresist pattern is formed.

The acid-generating agent (B) includes ① onium salts, ② halongen-containing compounds, ③ diazoketone compounds, ④ sulfone compounds, and ⑤ sulfonic acid compounds.

Examples of these acid-generating agents (B) include the following.

① Onium Salts:

Onium salts include, for example, iodonium salts, sulfonium salts, phosphonium salts, diazonium salts and pyridinium salts.

Specific examples of preferable onium salts include diphenyliodonium triflate, diphenyliodonium pyrenesulfonate, diphenyliodonium dodecylbenzenesulfonate, bis(4-t-butylphenyl)iodonium triflate, bis(4-t-butylphenyl)iodonium dodecylbenzenesulfonate, bis(4-t-butylphenyl)iodonium naphthalenesulfonate, bis(4-t-butylphenyl)iodonium hexafluoroantimonate, triphenylsulfonium triflate, triphenylsulfonium hexafluoroantimonate, triphenylsulfonium naphthalenesulfonate, (hydroxyphenyl) benzenemethylsulfonium toluenesulfonate, 1-(naphthylacetomethyl)tetrahydro-thiophenium triflate, cyclohexylmethyl(2-oxocyclohexyl)sulfonium triflate, dicyclohexyl(2-oxocyclohexyl)sulfonium triflate, dimethyl (2-oxocyclohexyl)sulfonium triflate, dimethyl(4-hydroxynaphthyl)sulfonium triflate, dimethyl(4-hydroxynaphthyl)sulfonium tosylate, dimethyl(4-hydroxynaphthyl)sulfonium dodecylbenzenesulfonate, dimethyl(4-hydroxynaphthyl)sulfonium naphthalenesulfonate, diphenyliodonium hexafluoroantimonate, triphenylsulfonium camphorsulfonate and (4-hydroxyphenyl)benzylmethylsulfonium toluenesulfonate.

② Halogen-containing Compounds:

Halogen-containing compounds include, for example, haloalkyl group-containing hydrocarbon compounds and haloalkyl group-containing heterocyclic compounds.

Specific examples of preferable halogen-containing compounds include (trichloromethyl)-s-triazine derivatives such as phenyl-bis(trichloromethyl)-s-triazine, methoxyphenyl-bis(trichloromethyl)-s-triazine and naphthyl-bis (trichloromethyl)-s-triazine; and 1,1-bis(4-chlorophenyl)-2, 2,2-trichloroethane.

③ Diazoketone Compounds:

Diazoketone compounds include, for example, 1,3-diketo-2-diazo compounds, diazobenzoquinone compounds and diazonaphthoquinone compounds.

Specific examples of preferable diazoketones include 1,2-naphthoquinonediazide-4-sulfonylchloride, 1,2-naphthoquinonediazide-5-sulfonylchloride, 1,2-naphthoquinonediazide-4-sulfonic acid ester or 1,2-naphthoquinonediazide-5-sulfonic acid ester of 2,3,4,4'-tetrahydrobenzophenone, and 1,2-naphthoquinonediazide-4-sulfonic acid ester or 1,2-naphthoquinonediazide-5-sulfonic acid ester of 1,1,1-tris(hydroxyphenyl)ethane.

④ Sulfone Compounds:

Sulfone compounds include, for example, β-ketosulfones, β-sulfonylsulfones, and their α-diazo compounds.

Specific examples of preferable sulfone compounds include 4-trisphenacyl sulfone, mesityl phenacyl sulfone and bis(phenylsulfonyl)methane.

⑤ Sulfonic Acid Compounds:

Sulfonic acid compounds include, for example, alkylsulfonic acid esters, alkylsulfonic acid imides, haloalkylsulfonic acid esters, arylsulfonic acid esters and iminosulfonates.

Specific examples of preferable sulfonic acid compounds include benzoin tosylate, triflate of pyrogallol, nitrobenzyl-9,10-diethoxyanthracene-2-sulfonate, trifluoromethanesulfonylbicyclo[2.2.1]hept-5-ene-2,3-dicarbodiimide, N-hydroxysuccinimide triflate and 1,8-naphthalenedicarboxylic acid imide triflate.

Among these acid-generating agents (B), particularly preferred are diphenyliodonium triflate, bis(4-t-butylphenyl) iodonium triflate, triphenylsulfonium triflate, cyclohexylmethyl(2-oxocyclohexyl)sulfonium triflate, dicyclohexyl(2-oxocyclohexyl)sulfonium triflate, dimethyl (2-oxocyclohexyl)sulfonium triflate, 1-(naphthylacetomethyl)tetrahydro-thiophenium triflate, 4-hydroxynaphthyl)dimethylsulfonium triflate, dimethyl(4-hydroxynaphthyl)sulfonium triflate, trifluoromethanesulfonylbicyclo[2.2.1]hept-5-ene-2,3-dicarbodiimide, N-hydroxysuccinimide triflate and 1,8-naphthalenedicarboxylic acid imide triflate.

In the present invention, the acid-generating agent (B) can be used singly or in combination of two or more thereof.

The amount of the acid-generating agent (B) used is generally 0.1 to 10 parts by weight, preferably 0.5 to 7 parts by weight, per 100 parts by weight of the resin (A), from the viewpoint of ensuring sensitivity and developability as a photoresist. If the amount of the acid-generating agent (B) used is less than 0.1 part by weight, sensitivity and developability may be lowered. If the amount is more than 10 parts by weight, transparency for radiation is lowered and, as a result, it may show a tendency to obtain a rectangular photoresist pattern with difficulty.

In the case where the resin (A) contains an acid-cleavable group like the resin (AI), resin (AII), resin (AIII) and resin (AIV), the addition of a compound having a group which is cleavable by the action of an acid to increase affinity of the resin for an alkaline developing solution (hereinafter, referred to as "acid-cleavable additive") can further improve contrast as a chemically amplified positive type photoresist. In the case where the resin (A) used in a radiation-sensitive resin composition contains no acid-cleavable group, it is necessary to add an acid cleavable additive to the composition so that the composition can be used as a chemically amplified positive type photoresist.

The acid-cleavable additive includes, for example, polymeric compounds or low-molecular weight compounds having at least one acid-cleavable group such as, for example, hydroxyl group and/or carboxyl group protected with t-butyl group, hydroxyl group and/or carboxyl group protected with tetrahydropyranyl group, carboxyl group protected with 3-oxocyclohexyl group, carboxyl group protected with isobornyl group, hydroxyl group protected with t-butoxycarbonyl group, and the like.

The polymeric compounds out of the acid-cleavable additives include, for example, polymers and copolymers containing at least one repeated unit selected from the group consisting of t-butyl (meth)acrylate unit, tetrahydropyranyl (meth)acrylate unit, 3-oxocyclohexyl (meth)acrylate unit and isobornyl (meth)acrylate unit.

Specific examples of the polymeric compounds include t-butyl (meth)acrylate homopolymers, t-butyl (meth)acrylate/methyl (meth)acrylate copolymers, t-butyl (meth)acrylate/(meth)acrylic acid copolymers, t-butyl (meth)acrylate/methyl (meth)acrylate/(meth)acrylic acid copolymers, t-butyl (meth)acrylate/methyl (meth)acrylate/(meth)acrylic acid/adamantyl (meth)acrylate copolymers, t-butyl (meth)acrylate/methyl (meth)acrylate/(meth)acrylic acid/adamantylmethyl (meth)acrylate copolymers, t-butyl (meth)acrylate/methyl (meth)acrylate/(meth)acrylic acid/ tetracyclodekanyl (meth)acrylate copolymers, t-butyl (meth) acrylate/methyl (meth)acrylate/(meth)acrylic acid/ tetrahydropyranyl (meth)acrylate copolymers, t-butyl (meth)acrylate/methyl (meth)acrylate/(meth)acrylic acid/3-oxocyclohexyl (meth)acrylate copolymers, t-butyl (meth) acrylate/methyl (meth)acrylate/(meth)acrylic acid/isobornyl (meth)acrylate copolymers; tetrahydropyranyl (meth) acrylate homopolymers, tetrahydropyranyl (meth)acrylate/ methyl (meth)acrylate copolymers, tetrahydropyranyl (meth)acrylate/(meth)acrylic acid copolymers, tetrahydropyranyl (meth)acrylate/methyl (meth)acrylate/(meth)acrylic acid copolymers, tetrahydropyranyl (meth)acrylate/methyl (meth)acrylate/(meth)acrylic acid/adamantyl (meth)acrylate copolymers, tetrahydropyranyl (meth)acrylate/methyl (meth)acrylate/(meth)acrylic acid/adamantylmethyl (meth) acrylate copolymers, tetrahydropyranyl (meth)acrylate/ methyl (meth)acrylate/(meth)acrylic acid/tetracyclodecanyl (meth)acrylate copoymers, tetrahydropyranyl (meth) acrylate/methyl (meth)acrylate/(meth)acrylic acid/t-butyl (meth)acrylate copolymers, tetrahydropyranyl (meth) acrylate/methyl (meth)acrylate/(meth)acrylic acid/3-oxocyclohexyl (meth)acrylate copolymers, tetrahydropyranyl (meth)acrylate/methyl (meth)acrylate/(meth)acrylic acid/isobornyl (meth)acrylate copolymers; 3-oxocyclohexyl (meth)acrylate homopolymers, 3-oxocyclohexyl (meth) acrylate/methyl (meth)acrylate copolymers, 3-oxacyclohexyl (meth)acrylate/(meth)acrylic acid copolymers, 3-oxocyclohexyl (meth)acrylate/methyl (meth) acrylate/(meth)acrylic acid copolymers, 3-oxocyclohexyl (meth)acrylate/methyl (meth)acrylate/(meth)acrylic acid/ adamantyl (meth)acrylate copolymers, 3-oxocyclohexyl (meth)acrylate/methyl (meth)acrylate/(meth)acrylic acid/ adamantylmethyl (meth)acrylate copolymers, 3-oxocyclohexyl (meth)acrylate/methyl (meth)acrylate/ (meth)acrylic acid/tetracyclodecanyl (meth)acrylate copoymers, 3-oxocyclohexyl (meth)acrylate/methyl (meth) acrylate/(meth)acrylic acid/t-butyl (meth)acrylate copolymers, 3-oxocyclohexyl (meth)acrylate/methyl (meth) acrylate/(meth)acrylic acid/tetrahydropyranyl (meth) acrylate copolymers, 3-oxocyclohexyl (meth)acrylate/ methyl (meth)acrylate/(meth)acrylic acid/isobornyl (meth) acrylate copolymers; isobornyl (meth)acrylate homopolymers, isobornyl (meth)acrylate/methyl (meth) acrylate copolymers, isobornyl (meth)acrylate/(meth)acrylic acid copolymers, isobornyl (meth)acrylate/methyl (meth) acrylate/(meth)acrylic acid copolymers, isobornyl (meth) acrylate/methyl (meth)acrylate/(meth)acrylic acid/ adamantyl (meth)acrylate copolymers, isobornyl (meth) acrylate/methyl (meth)acrylate/(meth)acrylic acid/ adamantylmethyl (meth)acrylate copolymers, isobornyl (meth)acrylate/methyl (meth)acrylate/(meth)acrylic acid/ tetracyclodecanyl (meth)acrylate copolymers, isobornyl (meth)acrylate/methyl (meth)acrylate/(meth)acrylic acid/t-butyl (meth)acrylate copolymers, isobornyl (meth)acrylate/ methyl (meth)acrylate/(meth)acrylic acid/tetrahydropyranyl (meth)acrylate copolymers, isobornyl (meth)acrylate/ methyl (meth)acrylate/(meth)acrylic acid/3-oxocyclohexyl (meth)acrylate copolymers; and the like.

These polymeric compounds can be used singly or as a mixture of two or more.

Specific examples of the low-molecular weight compounds out of the acid-cleavable additives include t-butyl adamantane-carboxylate, tetrahydropyranyl adamantane-carboxylate, 3-oxocyclohexyl adamantane-carboxylate, t-butyl adamantyl acetate, tetrahydropyranyl adamantyl acetate, 3-oxocyclohexyl adamantyl acetate; t-butyl 1-naphtylacetate, tetrahydropyranyl 1-naphthylacetate, 3-oxocyclohexyl 1-naphthylacetate, t-butyl 2-naphthylacetate, tetrahydropyranyl 2-naphthylacetate, 3-oxocyclohexyl 2-naphthylacetate, 1-naphthoic acid t-butyl ester, 1-naphthoic acid tetrahydropyranyl ester, 1-naphthoic acid 3-oxocyclohexyl ester, 2-naphthoic acid t-butyl ester, 2-naphthoic acid tetrahydropyranyl ester, 2-naphthoic acid 3-oxocyclohexyl ester; cholic acid t-butyl ester, cholic acid tetrahydropyranyl ester, cholic acid 3-oxocyclohexyl ester; 1-t-butoxycarbonyloxynaphthalene, 2-t-butoxycarbonyloxynaphthalene, 1,5-bis(t-butoxycarbonyloxy)naphthalene, 1-carbo-t-butoxymethoxynaphthalene, 2-carbo-t-butoxymethoxynaphthalene, 1,5-bis(carbo-t-butoxymethoxy)naphthalene, and the like.

These low-molecular weight compounds can be used singly or as a mixture of two or more.

In the present invention, the polymeric compound and the low-molecular weight compound may be used in combination as the acid-cleavable additive.

The amount of the acid-cleavable additive to be added is normally 200 parts by weight or less, preferably 5 to 150 parts by weight, per 100 parts by weight of the resin (A). If the amount of the acid-cleavable additive exceeds 200 parts by weight, adhesion to a substrate may show a tendency to drop.

In the positive type radiation-sensitive resin composition of the present invention, the addition of a compound which acts as a Lewis base to an acid generated from the acid-generating agent (B) (hereinafter, referred to as "Lewis base additive") can improve perpendicularity of the side walls of a photoresist patter in section more effectively.

The Lewis base additive includes, for example, nitrogen-containing basic compounds and salts thereof, carboxylic acids, alcohols, etc. Preferred are the nitrogen-containing basic compounds.

Specific examples of the nitrogen-containing basic compounds include amine compounds such as triethylamine, tri n-propylamine, triisopropylamine, tri n-butylamine, tri n-hexyl amine, triethanolamine, triphenylamine, aniline, N,N-dimethylaniline, 2-methylaniline, 3-methylaniline, 4-methylaniline, 4-nitroaniline, 1-naphthylamine, 2-naphthylamine, diphenylamine, ethylenediamine, tetramethylenediamine, hexamethylenediamine, pyrrolidine, piperidine, etc.; imidazole compounds such as imidazole, 4-methylimidazole, 4-methyl-2-phenylimidazole, thiabendazole, etc.; pyridine compounds such as pyridine, 2-methylpyridine, 4-ethylpyridine, 2-hydroxypyridine, 4-hydroxypyridine, 2-phenylpyridine, 4-phenylpyridine, nicotinic acid, nicotinic acid amide, quinoline, acridine, etc.; and other nitrogen-containing heterocyclic compounds such as purine, 1,3,5-triazine, triphenyl-1,3,5-triazine, 1,2,3-triazole, 1,2,4-triazole, and urazol.

These nitrogen-containing basic compounds can be used singly or as a mixture of two or more.

The amount of the Lewis base additive to be added is normally 1 mol or less, preferably 0.05 to 1 mole, per mole of the acid-generating agent (B). If the amount of the Lewis base additive exceeds 1 mole, sensitivity as a photoresist of the radiation-sensitive composition may show a tendency to drop.

To the radiation-sensitive resin composition of the present invention can be added optionally a variety of other additives.

The additives include, for example, surface-active agents acting to improve coating properties, developability, and so forth.

The surface-active agents include, for example, nonionic surface active agents such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, and polyethylene glycol distearate, and the products available under the tradenames of KP341 (products of Shin-Etsu Chemical Co., Ltd.), Polyflow No. 75 and No. 95 (products of Kyoei-Sha Yushi Kagaku Kogyo K.K.), F-Top EF301, EF303 and EF352 (products of To-chem Products K.K.), Megafacs F171 and F173 (products of Dainippon Ink & Chemicals, Inc.), Fluorad FC430 and FC431 (products of Sumitomo 3M Co., Ltd.), and Asahi Guard AG710, Surflon S-382, SC-101, SC-102, SC-103, SC-104, SC-105 and SC-106 (products of Asahi Glass Co., Ltd.).

These surface-active agents can be used singly or as a mixture of two or more.

The amount of the surface active agent to be added is normally 2 parts by weight or less per 100 parts by weight of the total of the resin (A), the acid-generating agent (B, and the acid-cleavable additive.

Additives other than those described above include a halation preventive agent, adhesion aid, stabilizer, defoaming agent, etc.

The radiation-sensitive resin composition according to the present invention contains as essential components the resin (A) and the acid-generating agent (B), and optionally may contain the acid-cleavable additive, Lewis base additive, or other additives. The composition is useful as, particularly, a chemically amplified positive type photoresist.

In said chemically amplified positive type photoresist, the acid-generating agent (B) generates an acid upon exposure to radiation to produce an acid, and by the action of the acid the acid-cleavable group contained in the resin (A) and/or the acid-cleavable additive undergoes, for example:

(q) a reaction in which an alkoxycarbonyl group cleaves to be converted into an carboxyl group, (h) a reaction in which an alkylcarbonyloxy group cleaves to be converted into a hydroxyl group, (i) a reaction in which a cyano group cleaves to be converted into an carboxyl group, (j) a reaction in which an acid anhydride group cleaves to be converted into carboxyl groups, or the like, so that the exposed portions of the photoresist become readily soluble in an alkaline developing solution and are dissolved by the alkaline developing solution and removed away to give a photoresist pattern of positive type.

Preparation of Composition Solution

The radiation-sensitive resin composition according to the present invention is prepared as a composition solution before use by dissolving the components in a solvent so that the content of all the solid components may become, for example, 5 to 50% by weight and then normally filtering the resulting solution with a filter having a pore diameter of about 0.2 μm.

Solvents which can be used for preparation of said composition solution include, for example, n-propyl alcohol, isopropyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether acetate, propylene glycol monoethyl ether acetate, propylene glycol mono-n-propyl ether acetate, toluene, xylene, methyl ethyl ketone, methyl n-propyl ketone, isopropyl ketone, methyl n-butyl ketone, methyl isobutyl ketone, 2-heptanone, 3-heptanone, 4-heptanone, cyclopentanone, cyclohexanone, methyl 2-hydroxypropionate, ethyl 2-hydroxypropionate, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetate, methyl 3-methoxypropionate, ethyl 3-ethoxypropionate, methyl pyruvate, ethyl pyruvate, N-methylpyrrolidone, N,N-dimethylformamide, N,N-dimethylacetamide, benzyl ethyl ether, dihexyl ether, diethylene glycol monomethyl ether, diethylene glycol monoethyl ether, acetonylacetone, isophorone, capric acid, caprylic acid, 1-octanol, 1-nonanol, benzyl alcohol, benzyl acetate, ethyl benzoate, diethyl oxalate, diethyl maleate, y-butyrolactone, ethylene carbonate, propylene carbonate, and so forth.

These solvents can be used singly or as a mixture of two or more.

Method of Forming a Photoresist Pattern

To form a photoresist pattern from the radiation-sensitive resin composition of the present invention, the composition solution prepared as described above is applied to a substrate such as, for example, a silicon wafer, a wafer covered with aluminum or the like by a suitable coating method such as spin coating, flow-coating, roll coating or the like, to form a photoresist film, which is then optionally pre-baked, and thereafter the photoresist film is subjected to exposure so that a prescribed photoresist pattern may be formed. As radiation used in exposure, can be used a variety of radiations, e.g., far ultra-violet radiation such as KrF excimer laser (wave length: 248 nm) or ArF excimer laser (wave length: 193 nm), X ray such as synchrotron radiation, charged particle radiation such as electron beam, etc. Particularly, KrF excimer laser or ArF excimer laser is preferred, and ArF excimer laser is more preferred.

In the present invention, it is preferred to carry out heating treatment after the exposure (hereinafter, referred to as "post-exposure baking"). The post-exposure baking enables the reactions of (g)–(j) described above to proceed smoothly. Although the conditions of heating at the post-exposure baking vary depending on the formulation of a composition, heating is conducted normally at 30 to 200° C., preferably at 50 to 170° C.

To develop potential performance of the radiation-sensitive resin composition of the present invention it is possible to form an organic or inorganic anti-reflective coating on a substrate as disclosed in, for example, Japanese Patent Publication (kokoku) No. 6-12452, or to form a protective coating on a photoresist film for the purpose of preventing influence by basic impurities or the like contained in the environmental atmosphere as disclosed in, for example, Japanese Laid-open Patent Publication (kokai) No.5-188598, or to combine these techniques.

Subsequently, the exposed photoresist film is developed, and a prescribed photoresist pattern is thereby formed.

When the radiation-sensitive resin composition of the present invention is used as a chemically amplified positive type photoresist, developing solutions which are preferably used include, for example, alkaline aqueous solutions containing at least one alkaline compound such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, demethylamine, triethanolamine, tetramethylammonium hydroxide, pyrrole, piperidine, choline, 1,8-diazabicyclo[5.4.0]-7-undecene, 1,5-diazabicyclo[4.3.0]-5-nonene or the like. The alkaline aqueous solutions normally have a concentration of 10% by weight or less. If the concentration exceeds 10% by weight, unexposed portions are also dissolved unfavorably.

To the developing solution of the alkaline aqueous solution, for example, an organic solvent can be added.

Specific examples of the organic solvent include ketones such as acetone, methyl ethyl ketone, methyl isobutyl ketone, cyclopentanone, cyclohexanone, 3-methyl-2-cyclopentanone, 2,6-dimethylcyclohexanone and the like; alcohols such as methyl alcohol, ethyl alcohol, n-propyl alcohol, isopropyl alcohol, n-butyl alcohol, t-butyl alcohol, cyclopentanol, cyclohexanol, 1,4-hexanediol, 1,4-hexanedimethylol, and the like; ethers such as tetrahydrofuran, dioxanes and the like; esters such as ethyl acetate, butyl acetate, isoamyl acetate and the like; aromatic hydrocarbons such as toluene, xylene and the like; and phenol, acetonylacetone, and dimethylformamide.

These organic solvents can be singly or as a mixture of two or more.

The amount of an organic solvent is preferably 100% by volume or less with respect to the alkaline aqueous solution. If the amount of the organic solvent exceeds 100% by volume, unfavorably developability is lowered and serious undeveloped residue is produced at developed portions.

To the developing solution of an alkaline aqueous solution can be added a surface active agent or the like in a proper amount.

Development with a developing solution of an alkaline aqueous solution is normally followed by washing with water and drying.

EXAMPLES

Embodiments of the present invention will be described below in greater detail by giving Examples. The present invention is by no means restricted by these Examples.

In the following Examples other than Example 4 and Comparative Examples, measurement and evaluation were made in the following way.

Mw:

Measured by gel permeation chromatography (GPC) of monodisperse-polystyrene standards, using GPC columns G2000HXL (two columns), G3000HXL (one column), and G4000HXL (one column), which were manufactured by Tosoh Co., Ltd., under analysis conditions of a flow rate being 1.0 ml/minute, an elution solvent being tetrahydrofuran and a column temperature being 40° C.

Radiation transmittance:

In respect of a resist film with a dry film thickness of 1.0 aim, formed by spin-coating each resin solution or composition solution on quartz glass, radiation transmittance was calculated from absorbance at a wavelength of 248 nm or wavelength of 193 nm, and the values obtained were used as measures for transparency in the far-ultraviolet radiation region.

Etching rate:

Each resin coat or resist film was subjected to dry etching using a dry etching device (DEM451, manufactured by Nichiden Anelva Co.) under conditions of an etching gas being $CF_4$, a gas flow rate being 30 sccm, a pressure being 5 Pa and a power output being 100 W to measure etching rate. The lower the etching rate is, the better the dry etching resistance is.

Adhesion to substrate:

After development, cleaned positive resist patterns with 0.30 μm line-and-space pairs (1L1S) were examined using a scanning electron microscope to observe how the patterns stood adhered. An instance where difficulties such as peeling or lifting of patters are not observed is evaluated as "good"; and an instance where such difficulties are seen, as "poor".

Sensitivity:

Each composition solution was spin-coated on silicone wafers, followed by prebaking for 1 minute on a hot plate kept at 110° C. to form a resist film having a thickness of 0.6 μm. The resist film thus formed was exposed to light through a mask pattern, using an ArF excimer laser exposure device manufactured by Nikon Corporation (number of lens aperture: 0.50; exposure wavelength: 193 nm). Subsequently, the resist film thus exposed was subjected to post-exposure baking for 1 minute on a hot plate kept at 90° C., and thereafter developed at 25° C. for 1 minute with an aqueous 2.38% by weight tetramethylammonium hydroxide solution, followed by washing with water and then drying to form a positive resist pattern. In this processing, the dose of exposure at which 0.35 μm line-and-space pairs were formed in a width ratio of 1:1 was regarded as an optimum dose of exposure, and this optimum dose of exposure was indicated as sensitivity.

Resolution:

The size of a minimum positive resist pattern resolved when exposed at the optimum dose of exposure was indicated as resolution.

Developability:

Positive resist patterns formed in the same manner as in the evaluation of sensitivity were examined using a scanning electron microscope to observe the degree of scum or undeveloped residue.

Synthesis Example 1

(1) Synthesis of 8-Methyl-8-methoxycarbonyltetracyclo[$4.4.0.1^{2,5}.1^{7,10}$]-3-dodecene:

Into a reaction vessel with an internal volume of 50 liters, having a stirrer and kept at a temperature of 180° C. and an internal pressure of 3.5 kg/cm².G, methyl methacrylate, dicyclopentadiene and 5-methyl-5-methoxycarbonylbicyclo[2.2.1]hept-2-ene were continuously fed at a molar ratio of 1:2.4 (in terms of cyclopentadiene unit): 2.4 by means of a constant rate pump while keeping the total feed rate at 4 kg per hour such that the residence time of the reaction materials in the reactor was 8 hours on the average. As a polymerization inhibitor, p-methoxyphenol was dissolved in methyl methacrylate, and the solution obtained was fed in an amount of 300 ppm (by weight) based on the total feed rate of the reaction materials.

During the reaction, the reaction product was drawn out of the reactor at a rate of 4 kg per hour, and continuously fed to a flash distillation column kept at a pressure of 300 Torr and a temperature of 105° C. to separate a part of unreacted starting materials.

The distillate from the flash distillation column was continuously fed to a distillation column of 3 inches in column diameter, having a V.P.C. packing packed at a height of 119 cm at the enriching section and 102 cm at the recovery section to carry out distillation at a column top (overhead) pressure of 5 Torr and a reflux ratio of 1. Thus, the unreacted starting materials not separable in the flash distillation column were recovered from the column top and a solution containing 67% by weight of 8-methyl-8-methoxycarbonyltetracyclo[4.4.0.1$^{2,5}$.1$^{7,10}$]dodec-3-ene represented by the following formula (9) was collected from the column bottom.

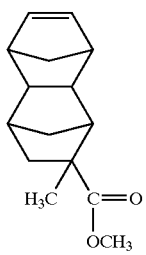

(9)

(2) Polymerization:

The inside of a separable flask having a stirrer, a reflux condenser and a three-way cock was replaced with nitrogen, and 100 parts by weight of 8-methyl-8-methoxycarbonyltetracyclo[4.4.0.1$^{2,5}$.1$^{7,10}$]dodec-3-ene, 33 parts by weight of 1-hexene (a molecular weight modifier) and 200 parts by weight of toluene were charged into the flask, followed by heating to 80° C. Subsequently, 0.17 part by weight of a toluene solution of triethylaluminum serving as a metathesis catalyst (concentration: 1.5 mole/liter) and 1.0 part by weight of a toluene solution of WCl$_6$ (concentration: 0.05 mole/liter) were added, followed by stirring at 80° C. for 3 hours to effect polymerization to obtain a solution of a resin having a repeating unit represented by the following formula (yield: 67% by weight). This resin is designated as resin A-1.

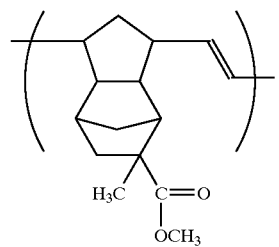

(3) Hydrogenation:

In an autoclave, 400 parts by weight of the resin A-1 and as a hydrogenation catalyst 0.075 part by weight of chlorohydrocarbonyltriphenylphosphine ruthenium were added, followed by treatment for 4 hours under the conditions of a hydrogen gas pressure of 100 kg/cm$^2$.G and a temperature of 165° C. to carry out hydrogenation reaction.

Subsequently, 400 parts by weight of the reaction solution obtained and 100 parts by weight of toluene were charged into another reaction vessel, and 0.71 part by weight of lactic acid and 1.15 parts by weight of water were added thereto. The mixture obtained was stirred at 60° C. for 30 minutes, followed by adding of 260 parts by weight of methyl alcohol, and the mixture obtained was further stirred at 60° C. for 1 hour. Thereafter, the reaction vessel was cooled to room temperature to separate its content into a bad solvent phase (methyl alcohol phase) and a good solvent phase (resin solution phase), and then only the bad solvent phase was drawn out. Thereafter, methyl alcohol corresponding to 4.5% by weight of the methyl alcohol drawn out and toluene corresponding to 55% by weight of the same were added in the reaction vessel, followed by stirring at 60° C. for 1 hour. Thereafter, the reaction vessel was again cooled to room temperature to separate its content into a bad solvent phase and a good solvent phase, and then only the bad solvent phase was drawn out. This operation of extraction with methyl alcohol was repeated several times. Then, the good solvent phase was separated and the solvent was evaporated from the good solvent phase to recover the resin. Subsequently, the resin obtained was again dissolved in tetrahydrofuran, and thereafter again solidified with a large quantity of methyl alcohol. The resin thus solidified was dried under reduced pressure to obtain a purified resin.

This resin had a hydrogenation degree of 100% as measured by NMR spectroscopy, and was a random copolymer having a repeating unit represented by the following formula and having an Mw of 15,000. This resin is designated as resin AII-1.

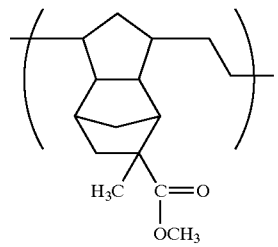

(4) Hydrolysis:

Into a flask, 100 parts by weight of the resin AII-1, 200 parts by weight of propylene glycol monoethyl ether, 100 parts by weight of distilled water and 10 parts by weight of potassium hydroxide to carry out hydrolysis for 36 hours under reflux in an atmosphere of nitrogen. Subsequently, the reaction solution was cooled and thereafter dropwise added in an aqueous solution prepared by dissolving oxalic acid dihydrate in an amount of 1.1 equivalent weight with respect to the sodium hydroxide to solidify the resin.

The resin obtained had a hydrolysis degree of 80% as measured by infrared spectroscopy and was a random copolymer having repeating units represented by the following formulas. This resin is designated as resin AIII-1.

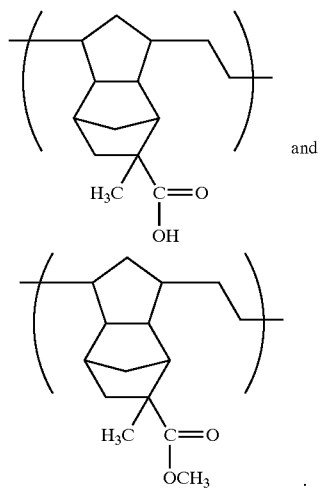

and (5) Introduction of Protective Group:

Into a flask, 100 parts by weight of the resin AIII-1, 200 parts by weight of dry tetrahydrofuran, 100 parts by weight of dihydropyran and 2 parts by weight of pyridinium p-toluenesulfonate were charged, followed by stirring for 36 hours at room temperature in an atmosphere of nitrogen. Subsequently, 200 parts by weight of ethyl acetate and 400 parts by weight of distilled water were added thereto. The mixture obtained was stirred and thereafter left to stand to separate the organic layer. This organic layer was washed with water several times, and thereafter the tetrahydrofuran and excess dihydropyran were evaporated, followed by drying in vacuo to obtain a purified resin.

The resin obtained had a degree of esterification with the tetrahydropyranyl ester group of 95% as measured by infrared spectroscopy and was a random copolymer having repeating units represented by the following formulas (10-1), (10-2) and (10-3), the repeating units being at a molar ratio of (10-1)/(10-2)/(10-3)=20/4/76; and having an Mw of 18,000. This resin is designated as resin AIII-2.

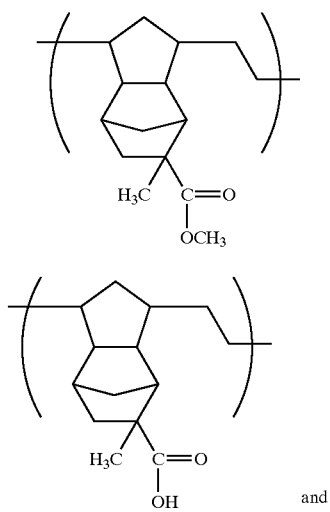

and

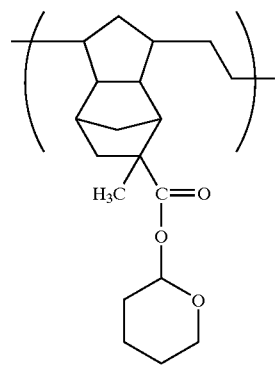

Synthesis Example 2

(1) Polymerization:

Into the separable flask as used in the step (2) in Synthesis Example 1, and in a stream of nitrogen, 60 parts by weight of 5-methyl-5-methoxycarbonylbicyclo[2.2.1]hept-2-ene, 40 parts by weight of 8-methyl-8-methoxycarbonyltetracyclo[$4.4.0.1^{2,5}.1^{7,10}$]dodec-3-ene, 25 parts by weight of 1-hexene (a molecular weight modifier), 400 parts by weight of 1,2-dichloroethane, 0.6 part by weight of a chlorobenzene solution of triethylaluminum serving as a metathesis catalyst (concentration: 1.5 mole/liter) and 4 parts by weight of a chlorobenzene solution of tungsten hexachloride (concentration: 10.025 mole/liter) were charged to carry out ring-opening copolymerization at 80° C. for 3 hours. After the polymerization was completed, a large quantity of methanol was added to the polymerization solution to solidify the copolymer, and the copolymer solidified was separated by filtration, followed by drying in vacuo to obtain a random copolymer having repeating units represented by the following formulas (yield: 92% by weight). This copolymer is designated as resin A-2.

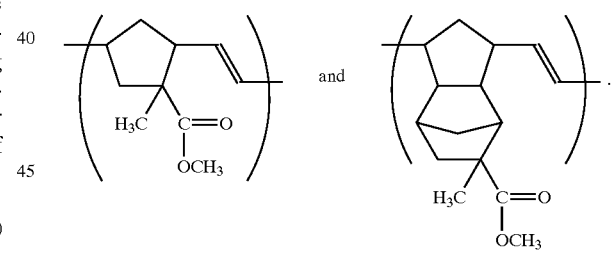

(2) Hydrogenation:

In an autoclave, 100 parts by weight of the resin A-2 and, as a hydrogenation catalyst, 10 parts by weight of rhodium supported on activated carbon (rhodium content: 5% by weight) were added, and thereafter the mixture obtained was dissolved in 2,000 parts by weight of tetrahydrofuran to carry out hydrogenation reaction under 150° C. for 5 hours under a hydrogen pressure set at 150 kg/cm². After the reaction was completed, the hydrogen gas in the reaction vessel was released and also the hydrogenation catalyst was filtered off from the reaction solution, followed by adding methanol to solidify hydrogenated resin. Subsequently, this resin was again dissolved in tetrahydrofuran, followed by adding methanol to again solidify the resin. The resin thus solidified was separated by filtration, and then dried in vacuo to obtain a purified resin.

This resin had a hydrogenation degree of 100% as measured by infrared spectroscopy and NMR spectroscopy, and was a random copolymer having repeating units represented by the following formulas. This resin is designated as resin AIV-1.

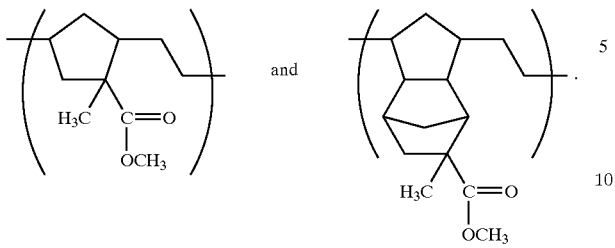

(3) Hydrolysis:

In an autoclave, 100 parts by weight of the resin AIV-1 was dissolved in 300 parts by weight of tetrahydrofuran, and 10 parts by weight of water and 10 parts by weight of 85% by weight potassium hydroxide were further added to carry out hydrolysis reaction at 140° C. for 8 hours. Subsequently, the reaction solution was cooled and then 200 parts by weight of an aqueous solution containing 10% by weight oxalic acid dihydrate was added to neutralize the solution, followed by extracting the resin with 500 parts by weight of methyl isobutyl ketone. Thereafter, the resin solution layer obtained was washed with water twice, and then poured into n-hexane to solidify the resin. The resin thus solidified was separated by filtration, and then dried in vacuo to obtain a purified resin.

This resin had a hydrolysis degree of 70% as measured by infrared spectroscopy and was a random copolymer having repeating units represented by the following formulas. This resin is designated as resin AIII-3.

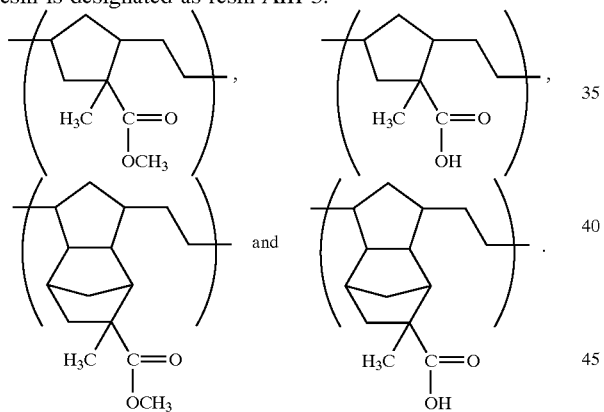

(4) Introduction of Protective Group:

Into a flask, 100 parts by weight of the resin AIII-3 was dissolved in 400 parts by weight of ethyl acetate, and 50 parts by weight of 3,4-dihydro-2H-pyran and, as a reaction catalyst, 3 parts by weight of pyridinium p-toluenesulfonate were added to carry out the reaction at 25° C. for 8 hours. Subsequently, the operation of adding water and then separating the aqueous layer was repeated three times to remove acid components. The resin solution obtained was poured into n-hexane to solidify the resin. The resin thus solidified was separated by filtration, and then dried in vacuo to obtain a purified resin.

The resin obtained had a degree of esterification with the tetrahydropyranyloxycarbonyl group (of 85%) as measured by infrared spectroscopy and was a random copolymer having repeating units represented by the following formulas (11-1) to (11-6), the repeating units being at a molar ratio of (11-1)/(11-2)/(11-3)(11-4)/(11-5)/(11-6)=20/6/39/21/11/3; and having an Mw of 32,000. This resin is designated as resin AIII-4.

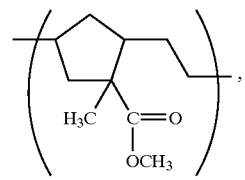

(11-1)

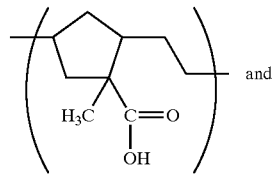

(11-2)

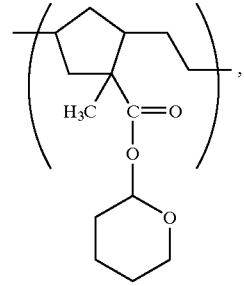

(11-3)

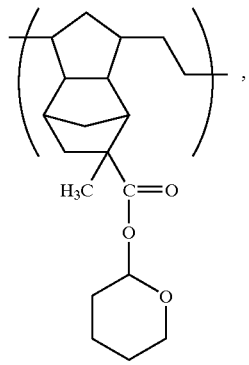

(11-4)

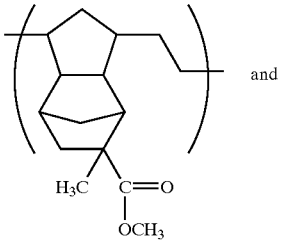

(11-5)

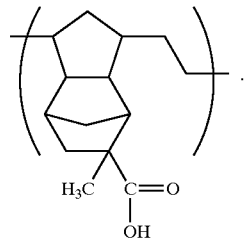

(11-6)

Synthesis Example 3

(1) Polymerization:

Into the separable flask as used in the step (2) in Synthesis Example 2, and in a stream of nitrogen, 70 parts by weight of 5-methyl-5-butoxycarbonylbicyclo[2.2.1]hept-2-ene, 30 parts by weight of 8,9-dicarboxylic anhydride tetracyclo[4.4.0.1$^{2,5}$.1$^{7,10}$]dodec-3-ene, 20 parts by weight of 1-hexene (a molecular weight modifier), 400 parts by weight of 1,2-dichloroethane, 1.7 parts by weight of an n-hexane solution of diethylaluminum chloride serving as a metathesis catalyst (concentration: 10% by weight), 1.8 part by weight of a chlorobenzene solution of tungsten hexachloride (concentration: 2% by weight) and 0.1 parts by weight of a 1,2-dichloroethane solution of para-aldehyde (concentration: 10% by weight) were charged to carry out ring-opening copolymerization at 60° C. for 7 hours. After the polymerization was completed, a large quantity of methanol was added to the polymerization solution to solidify the copolymer, and the copolymer solidified was separated by filtration, followed by drying in vacuo to obtain a random copolymer having repeating units represented by the following formulas (yield: 94% by weight). This copolymer is designated as resin A-3.

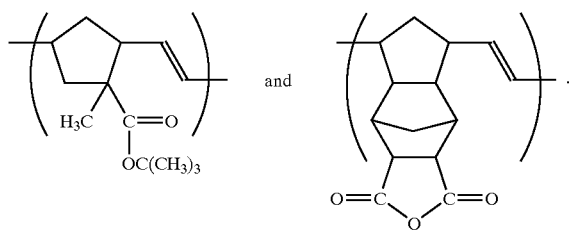

(2) Hydrogenation:

The resin A-3 was hydrogenated and purified in the same manner as in the step (2) of Synthesis Example 2.

This resin had a hydrogenation degree of 100% as measured by infrared spectroscopy and NMR spectroscopy, and was a random copolymer having repeating units represented by the following formulas (12-1) and (12-2), the repeating units being at a molar ratio of (12-1)/(12-2)=72/28; and having an Mw of 29,000. This resin is designated as resin AII-2.

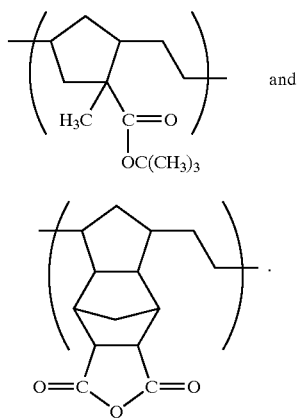

Synthesis Example 4

(1) Polymerization:

The procedure of the step (1) in Synthesis Example 2 was repeated except for using as monomers 70 parts by weight of 5-methyl-5-methoxycarbonylbicyclo[2.2.1]hept-2-ene and 30 parts by weight of 8,9-dicarboxylic anhydride tetracyclo[4.4.0.1$^{2,5}$.1$^{7,10}$]dodec-3-ene and, as a molecular weight modifier, 20 parts by weight of 1-hexene. Thus, a random copolymer having repeating units represented by the following formulas (yield: 90% by weight) was obtained. This copolymer is designated as resin A-4.

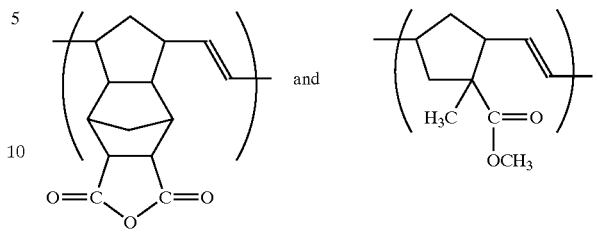

(2) Hydrogenation:

The resin A-4 was hydrogenated and purified in the same manner as in the step (2) of Synthesis Example 2.

This resin had a hydrogenation degree of 100% as measured by infrared spectroscopy and NMR spectroscopy, and was a random copolymer having repeating units represented by the following formulas and having an Mw of 27,000. This resin is designated as resin AII-3.

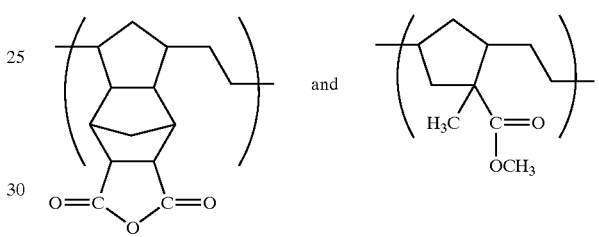

(3) Hydrolysis:

In a flask, 100 parts by weight of the resin AII-3 was dissolved in 200 parts by weight of tetrahydrofuran, and 100 parts by weight of water was further added to carry out hydrolysis reaction for 12 hours under reflux. Subsequently, the tetrahydrofuran and water were evaporated from the reaction solution to obtain a resin.

This resin had a hydrolysis degree of 100% as measured by infrared spectroscopy and was a random copolymer having repeating units represented by the following formulas. This resin is designated as resin A-5.

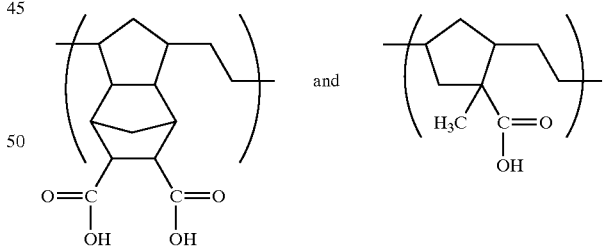

(4) Introduction of Protective Group:

Into a flask, 100 parts by weight of the resin A-5 was dissolved in 100 parts by weight of ethyl acetate, and 50 parts by weight of 3,4-dihydro-2H-pyran and, as a reaction catalyst, 2.5 parts by weight of pyridinium p-toluenesulfonate were added to carry out the reaction at 25° C. for 14 hours. Subsequently, the operation of adding water and then separating the aqueous layer was repeated three times to remove acid components. The resin solution obtained was poured into n-hexane to solidify the resin. The resin thus solidified was separated by filtration, and then dried in vacuo to obtain a purified resin.

The resin obtained had a degree of esterification with the tetrahydropyranyloxycarbonyl group (of 100%) as measured by infrared spectroscopy and was a random copolymer having repeating units represented by the following formulas (13-1) and (13-2), the repeating units being at a molar ratio of (13-1)/(13-2)=22/78; and having an Mw of 25,000. This resin is designated as resin AII-4.

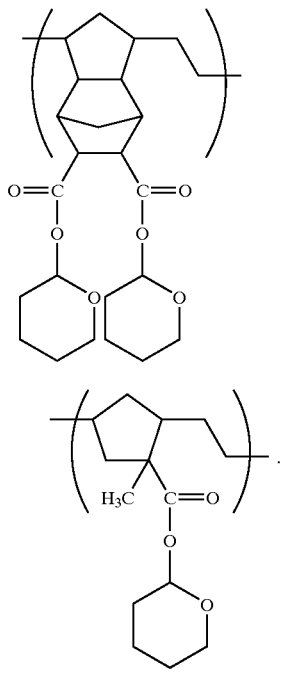

(13-1) and (13-2)

Synthesis Example 5
(1) Polymerization:

The procedure of the step (1) in Synthesis Example 2 was repeated except for using as monomers 70 parts by weight of 8-methyl-8-t-butoxycarbonyltetracyclo[4.4.0.1$^{2,5}$.1$^{7,10}$]dodec-3-ene and 30 parts by weight of 5-methyl-5-phenoxycarbonylbicyclo[2.2.1]hept-2-ene, and, as a molecular weight modifier, 18 parts by weight of 1-hexene. Thus, a random copolymer having repeating units represented by the following formulas (yield: 95% by weight) was obtained. This copolymer is designated as resin A-6.

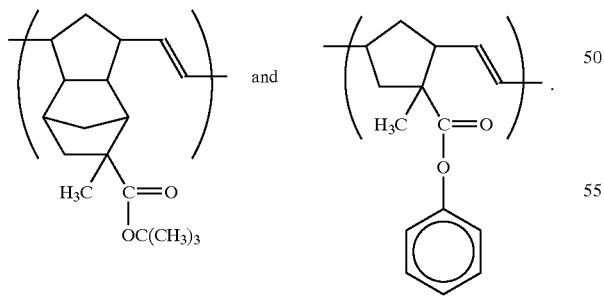

(2) Hydrogenation:

The resin A-6 was hydrogenated and purified in the same manner as in the step (2) of Synthesis Example 2.

This resin had a hydrogenation degree of 100% as measured by infrared spectroscopy and NMR spectroscopy, and was a random copolymer having repeating units represented by the following formulas. This resin is designated as resin AIV-2.

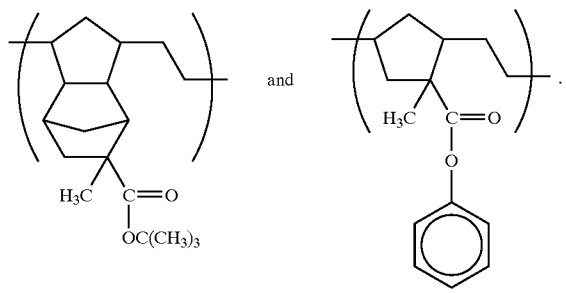

(3) Hydrolysis:

In a flask, 100 parts by weight of the resin AIV-2 was dissolved in 200 parts by weight of tetrahydrofuran, and 50 parts by weight of an aqueous 2.38% by solution weight of tetramethylammonium hydroxide was further added to carry out hydrolysis reaction for 12 hours under reflux. Subsequently, the reaction solution was cooled and then 15 parts by weight of an aqueous solution containing 10% by weight oxalic acid dihydrate was added to neutralize the solution, followed by extracting the resin with 400 parts by weight of ethyl acetate. Thereafter, the resin solution layer obtained was washed with water three times, and then poured into n-hexane to solidify the resin. The resin thus solidified was separated by filtration, and then dried in vacuo to obtain a purified resin.

This resin was confirmed by NMR spectroscopy that its phenoxy carbonyl groups had been quantitatively hydrolyzed, and was a random copolymer having repeating units represented by the following formulas (14-1) and (14-2), the repeating units being at a molar ratio of (14-1)/(14-2)=18/82; and having an Mw of 31,000. This resin is designated as resin AIII-5.

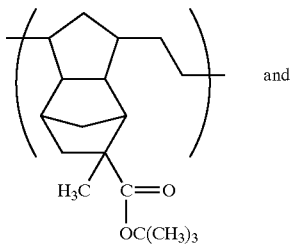

(14-1) and

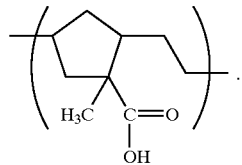

(14-2)

Synthesis Example 6
(1) Polymerization:

Into the separable flask as used in the step (2) in Synthesis Example 1, and in a stream of nitrogen, 70 parts by weight of 5-methyl-5-methoxycarbonylbicyclo[2.2.1]hept-2-ene, 30 parts by weight of 8-ethylidenetetracyclo[4.4.0.1$^{2,5}$.1$^{7,10}$]dodec-3-ene, 15 parts by weight of 1-hexene (a molecular weight modifier), 400 parts by weight of 1,2-dichloroethane, 0.6 part by weight of a chlorobenzene solution of triethylaluminum serving as a metathesis catalyst (concentration: 1.5 mole/liter) and 4 parts by weight of a chlorobenzene solution of tungsten hexachloride (concentration: 10.025 mole/liter) were charged to carry out ring-opening copolymerization at 80° C. for 3 hours. After the polymerization was completed, a large quantity of methanol was added to the polymerization solution to solidify the copolymer, and the copolymer solidified was separated by filtration, followed by drying in vacuo to obtain a random copolymer having repeating units represented by the following formulas (yield: 87% by weight). This copolymer is designated as resin A-7.

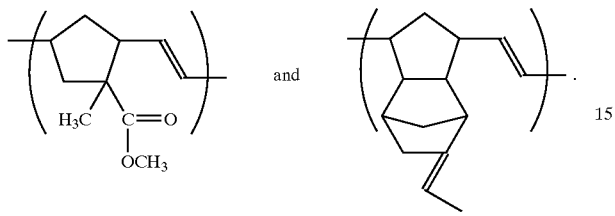

(2) Hydrogenation:

The resin A-7 was hydrogenated and purified in the same manner as in the step (2) of Synthesis Example 2.

This resin had a hydrogenation degree of 100% as measured by infrared spectroscopy and NMR spectroscopy, and was a random copolymer having repeating units represented by the following formulas. This resin is designated as resin AII-5.

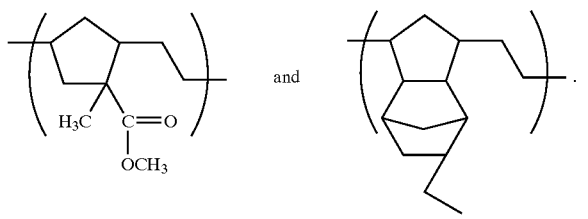

(3) Hydrolysis and Introduction of Protective Group:

The resin AII-5 was hydrolyzed in the same manner as in the step (3) of Synthesis Example 2 and then esterified in the same manner as in the step (4) of Synthesis Example 2.

The resin obtained had a degree of esterification with the tetrahydropyranyl group (of 70%) as measured by infrared spectroscopy and was a random copolymer having repeating units represented by the following formulas (15-1) to (15-4), the repeating units being at a molar ratio of (15-1)/(15-2)/(15-3)/(15-4)=21/19/45/15; and having an Mw of 33,000. This resin is designated as resin AIII-6.

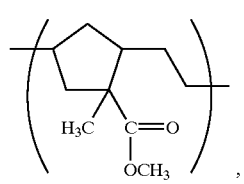
(15-1)

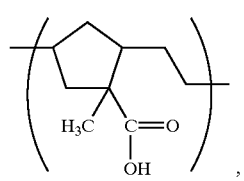
(15-2)

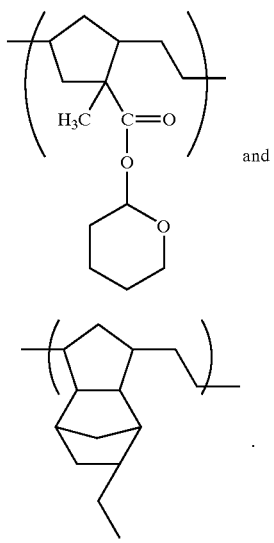
(15-3)

and (15-4)

Synthesis Example 7

(1) Polymerization:

Into the separable flask as used in the step (1) in Synthesis Example 1, and in a stream of nitrogen, 216 parts by weight of 8-methyl-8-methoxycarbonyltetracyclo[$4.4.0.1^{2,5}.1^{7,10}$] dodec-3-ene, 98 parts by weight of maleic anhydride, 16.4 parts by weight of azobisisobutyronitrile and 157 parts by weight of tetrahydrofuran were charged to carry out polymerization at 80° C. for 18 hours. After the polymerization was completed, the reaction solution obtained was poured into a large quantity of methanol to solidify the copolymer. Subsequently, the copolymer solidified was again dissolved in tetrahydrofuran and then poured into a large quantity of n-hexane to again solidify the copolymer. The copolymer solidified was separated by filtration, followed by drying in vacuo to obtain an alternating copolymer having a repeating unit represented by the following formula (yield: 55% by weight), and having an Mw of 4,500. This copolymer is designated as resin AII-a.

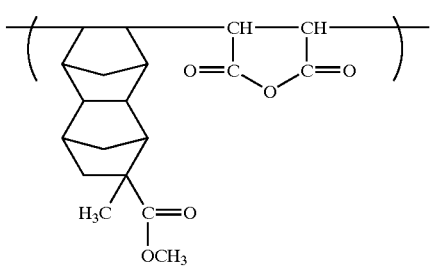

(2) Solvolysis:

In a flask, 100 parts by weight of the resin AII-a was dissolved in 500 parts by weight of dry t-butyl alcohol. Thereafter, in an atmosphere of nitrogen, the reaction was carried out under reflux for 12 hours to thereby solvolyze the anhydride groups in the resin to convert it into an half ester to obtain an alternating copolymer having a repeating unit represented by the following formula and having an Mw of 5,400.

This resin was measured by infrared spectroscopy and NMR spectroscopy to confirm that the half-esterification reaction had substantially quantitatively proceeded. This resin is designated as resin AII-b.

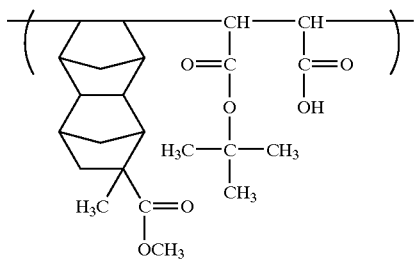

Synthesis Example 8

(1) Synthesis of 5-t-Butoxycarbonylbicyclo[2.2.1]hept-2-ene and 8-t-Butoxycarbonyltetracyclo[4.4.0.1$^{2,5}$.1$^{7,10}$] dodec-3-ene:

Into an autoclave with an internal volume of 2 liters, 256.3 g of t-butyl acrylate, 264.4 g of dicyclopentadiene and 1,040 g of toluene were charged, and the reaction was carried out at a temperature of 170° C. or higher for 5 hours. Subsequently, the reaction product was drawn out, and the toluene was evaporated, followed by distillation using a distillation column at 8.0 Torr and 87° C. to obtain 250 g of 5-t-butoxycarbonylbicyclo[2.2.1]hept-2-ene with a purity of 99.9% by weight. Using the same distillation column, the product was distilled at 0.07 Torr and 97 to 102° C. to obtain 100 g of 8-t-butoxycarbonyltetracyclo[4.4.0.1$^{2,5}$.1$^{7,10}$] dodec-3-ene with a purity of 99.9% by weight:

(2) Polymerization:

Into the separable flask as used in the step (2) in Synthesis Example 1, and in a stream of nitrogen, 40 parts by weight of 5-t-butoxycarbonylbicyclo[2.2.1]hept-2-ene, 26 parts by weight of 1-hexene (a molecular weight modifier) and 80 parts by weight of toluene were charged, followed by heating to 80° C. Subsequently, 5.14 parts by weight of a toluene solution of triethylaluminum serving as a metathesis catalyst (concentration: 0.123 mole/liter) and 3.4 parts by weight of a toluene solution of WCl$_6$ (concentration: 0.025 mole/liter) were added, followed by stirring at 80° C. for 3 hours to effect polymerization to obtain a solution of a resin having a repeating unit represented by the following formula (yield: 60% by weight). This resin is designated as resin A-10.

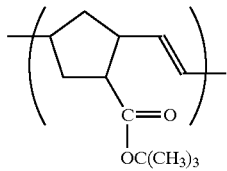

(3) Hydrogenation:

The resin A-10 was hydrogenated and purified in the same manner as in the step (3) of Synthesis Example 1 to obtain a resin having a hydrogenation degree of 100% as measured by NMR spectroscopy, having a repeating unit represented by the following formula and having an Mw of 42,000. This resin is designated as resin AII-6.

(4) Cut-down of Impurities:

A toluene solution of the resin AII-6 was mixed with an aqueous solution of 5% by weight triethanolamine. The mixture obtained was stirred at 70° C. for 12 hours, and then left to stand to effect separation to remove the aqueous layer. This operation was repeated 10 times, followed by washing with water three times. Subsequently, the resin was again solidified with methyl alcohol, and the resin solidified was filtered, and then dried. This resin is designated as resin AII-6a.

The resin AII-6a had residual tungsten, residual aluminum and residual ruthenium in a content not more than 250 ppb each, and residual chlorine not more than 50 ppb. On the other hand, the resin AII-6 had residual tungsten in a content of 6 ppm, and residual chlorine in a content of 10 ppm.

To determine the content of the residual metals in the resin AII-6a and resin AII-6, each resin was baked using a muffle furnace to effect ashing, and then the metals were determined using an inducibly coupled plasma emission spectroscopic analyzer SPS7700, manufactured by Seiko Denshi Kogyo K. K. To determine the content of the residual chlorine, a film of each resin was formed on an aluminum plate, and the chlorine was determined using a fluorescent X-ray analyzer Model PW1404, manufactured by Philips Co.

(5) Hydrolysis:

Into a flask, 100 parts by weight of the resin AII-6a, 200 parts by weight of propylene glycol monoethyl ether and 10 parts by weight of 20% by weight sulfuric acid were charged to carry out hydrolysis for 8 hours under reflux in an atmosphere of nitrogen. Subsequently, the reaction solution was cooled, and thereafter 200 parts by weight of water and 200 parts by weight of ethyl acetate were added to carry out extraction operation. Thereafter, the resin layer obtained was washed with water three times, and then dropwise added in a large quantity of n-hexane to again solidify the resin. The resin solidified was dried under reduced pressure.

The resin thus obtained was measured by infrared spectroscopy to confirm that the hydrolysis reaction quantitatively proceeded, and was a resin having a repeating unit represented by the following formula. This resin is designated as resin A-11.

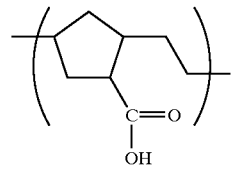

(6) Introduction of Protective Group:

Into a flask, 100 parts by weight of the resin AII, 200 parts by weight of dry tetrahydrofuran, 100 parts by weight of dihydropyran and 2 parts by weight of pyridinium p-toluenesulfonate were charged, followed by stirring for 36 hours at room temperature in an atmosphere of nitrogen. Subsequently, 200 parts by weight of ethyl acetate and 400 parts by weight of distilled water were added thereto. The mixture obtained was stirred and thereafter left to stand to separate the organic layer. This organic layer was washed with water several times, and thereafter the tetrahydrofuran and excess dihydropyran were evaporated, followed by drying in vacuo to obtain a purified resin.

The resin obtained had a degree of esterification with the tetrahydropyranyl ester group (of 98%) as measured by infrared spectroscopy and was a random copolymer having repeating units represented by the following formulas (16-1) and (16-2), the repeating units being at a molar ratio of (16-1)/(16-2)=2/98; and having an Mw of 25,000 and a glass transition point of 95° C. This resin is designated as resin AIII-7.

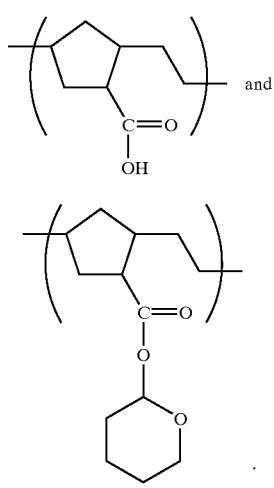

(16-1)

and (16-2)

Synthesis Example 9

(1) Polymerization:

Into the separable flask as used in the step (2) in Synthesis Example 1, and in a stream of nitrogen, 60 parts by weight of 5-t-butoxycarbonylbicyclo[2.2.1]hept-2-ene and 20 parts by weight of 8-t-butoxycarbonyltetracyclo[$4.4.0.1^{2,5}.1^{7,10}$] dodec-3-ene, obtained in the step (1) in Synthesis Example 8, 12 parts by weight of 1-hexene (a molecular weight modifier) and 160 parts by weight of toluene were charged, followed by heating to 80° C. Subsequently, 15 parts by weight of a toluene solution of triethylaluminum serving as a metathesis catalyst (concentration: 0.123 mole/liter) and 9.3 parts by weight of a toluene solution of $WCl_6$ (concentration: 0.025 mole/liter) were added, followed by stirring at 80° C. for 3 hours to effect polymerization to obtain a solution of a random copolymer having repeating units represented by the following formulas (yield: 50% by weight). This resin is designated as resin A-12.

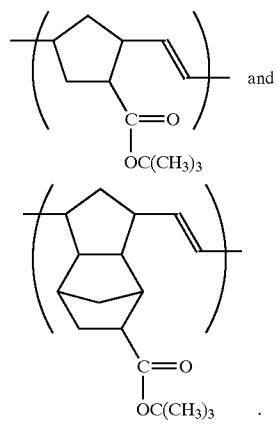

(2) Hydrogenation:

The resin A-12 was hydrogenated and purified in the same manner as in the step (3) of Synthesis Example 1 to obtain a random copolymer having a hydrogenation degree of 100% as measured by NMR spectroscopy, having repeating units represented by the following formulas and having an Mw of 34,000. This resin is designated as resin AIV-3.

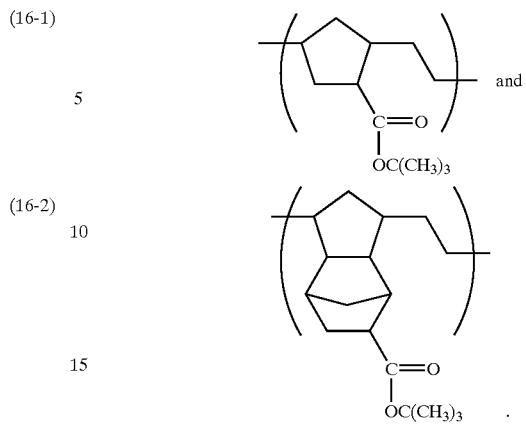

(3) Hydrolysis:

Into a flask, 100 parts by weight of the resin AIV-3, 200 parts by weight of propylene glycol monoethyl ether and 10 parts by weight of 20% by weight sulfuric acid were charged to carry out hydrolysis for 8 hours under reflux in an atmosphere of nitrogen. Subsequently, the reaction solution was cooled, and thereafter 200 parts by weight of water and 200 parts by weight of ethyl acetate were added to carry out extraction. Thereafter, the resin layer obtained was washed with water three times, and then dropwise added in a large quantity of n-hexane to again solidify the resin. The resin solidified was dried under reduced pressure.

The resin thus obtained was measured by infrared spectroscopy to confirm that the hydrolysis reaction quantitatively proceeded, and was a random copolymer having repeating units represented by the following formulas. This resin is designated as resin A-13.

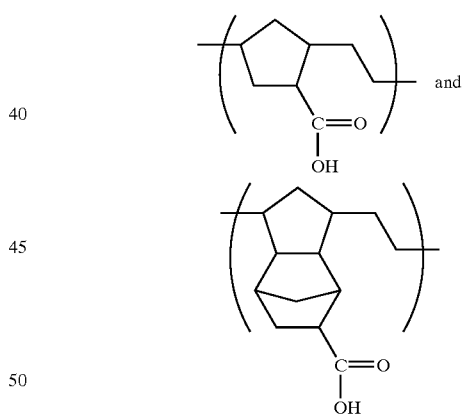

(4) Introduction of Protective Group:

Into a flask, 100 parts by weight of the resin A-13, 200 parts by weight of dry tetrahydrofuran, 100 parts by weight of dihydropyran and 2 parts by weight of pyridinium p-toluenesulfonate were charged, followed by stirring for 48 hours at 30° C. in an atmosphere of nitrogen. Subsequently, 200 parts by weight of ethyl acetate and 400 parts by weight of distilled water were added thereto. The mixture obtained was stirred and thereafter left to stand to separate the organic layer. This organic layer was washed with water several times, and thereafter the tetrahydrofuran and excess dihydropyran were evaporated, followed by drying in vacuo to obtain a purified resin.

The resin obtained had a degree of esterification with the tetrahydropyranyl ester group (of 97%) as measured by infrared spectroscopy and was a random copolymer having repeating units represented by the following formulas (17-1) to (17-4), the repeating units being at a molar ratio of (17-1)/(17-2)/(17-3)/(17-4)=1/2/81/16; and having an Mw of 32,000. This resin is designated as resin AIII-8.

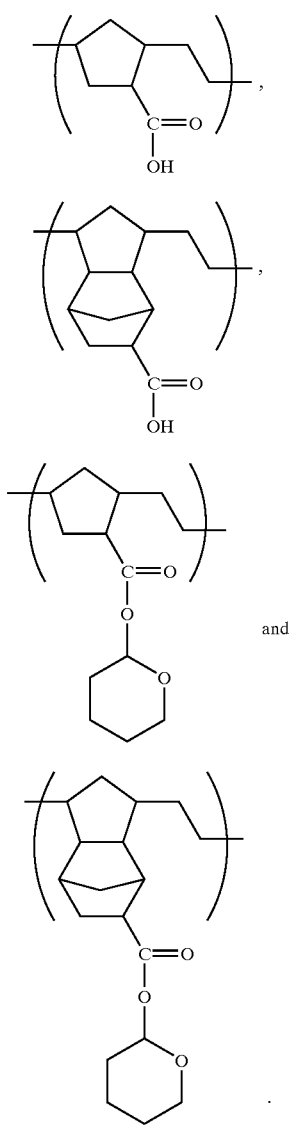

Synthesis Example 10

(1) Polymerization:

Into the separable flask as used in the step (2) in Synthesis Example 1, and in a stream of nitrogen, 34.3 parts by weight of 5-t-butoxycarbonylbicyclo[2.2.1]hept-2-ene and 45.7 parts by weight of 8-t-butoxycarbonyltetracyclododec[4.4.0.1$^{2,5}$.1$^{7,10}$]dodec-3-ene, obtained in the step (1) in Synthesis Example 8, 22 parts by weight of 1-hexene (a molecular weight modifier) and 160 parts by weight of toluene were charged, followed by heating to 80° C. Subsequently, 4 parts by weight of a toluene solution of triethylaluminum serving as a metathesis catalyst (concentration: 0.575 mole/liter) and 11.4 parts by weight of a toluene solution of WCl$_6$ (concentration: 0.025 mole/liter) were added, followed by stirring at 80° C. for 3 hours to effect polymerization to obtain a solution of a random copolymer having repeating units represented by the following formulas (yield: 65% by weight). This resin is designated as resin A-14.

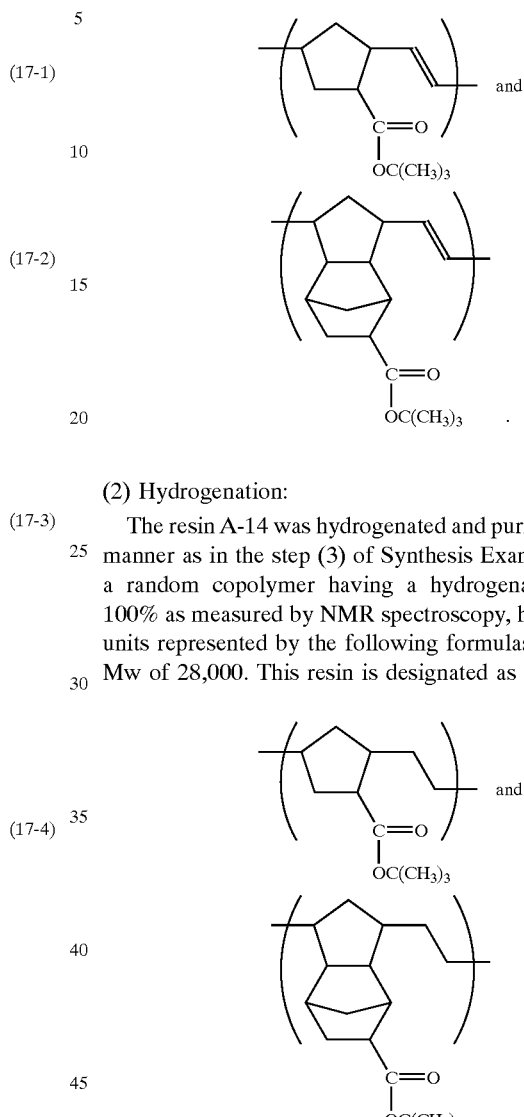

(2) Hydrogenation:

The resin A-14 was hydrogenated and purified in the same manner as in the step (3) of Synthesis Example 1 to obtain a random copolymer having a hydrogenation degree of 100% as measured by NMR spectroscopy, having repeating units represented by the following formulas and having an Mw of 28,000. This resin is designated as resin AIV-4.

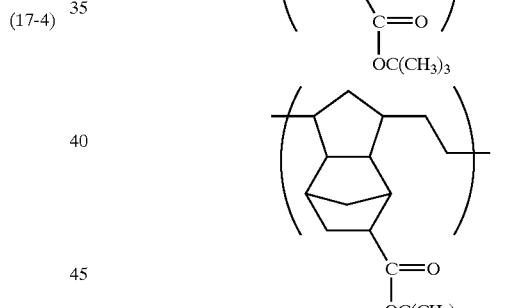

(3) Hydrolysis:

Into a flask, 100 parts by weight of the resin AIV-4, 200 parts by weight of propylene glycol monoethyl ether and 10 parts by weight of 20% by weight sulfuric acid were charged to carry out hydrolysis for 8 hours under reflux in an atmosphere of nitrogen. Subsequently, the reaction solution was cooled, and thereafter 200 parts by weight of water and 200 parts by weight of ethyl acetate were added to carry out extraction. Thereafter, the resin layer obtained was washed with water three times, and then dropwise added in a large quantity of n-hexane to again solidify the resin. The resin solidified was dried under reduced pressure.

The resin thus obtained was measured by infrared spectroscopy to confirm that the hydrolysis reaction quantitatively proceeded, and was a random copolymer having repeating units represented by the following formulas. This resin is designated as resin A-15.

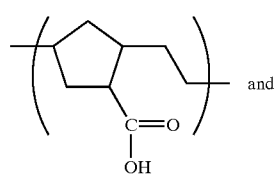 and

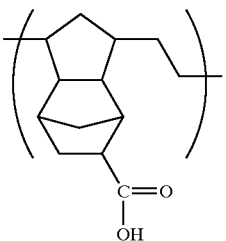

(4) Introduction of Protective Group:

Into a flask, 100 parts by weight of the resin A-15, 200 parts by weight of dry tetrahydrofuran, 100 parts by weight of dihydropyran and 2 parts by weight of pyridinium p-toluenesulfonate were charged, followed by stirring for 48 hours at 30° C. in an atmosphere of nitrogen. Subsequently, 200 parts by weight of ethyl acetate and 400 parts by weight of distilled water were added thereto. The mixture obtained was stirred and thereafter left to stand to separate the organic layer. This organic layer was washed with water several times, and thereafter the tetrahydrofuran and excess dihydropyran were evaporated, followed by drying in vacuo to obtain a purified resin.

The resin obtained had a degree of esterification with the tetrahydropyranyl ester group (of 98%) as measured by infrared spectroscopy and was a random copolymer having repeating units represented by the following formulas (18-1) to (18-4), the repeating units being at a molar ratio of (18-1)/(18-2)/(18-3)/(18-4)=1/1/49/49; and having an Mw of 27,000. This resin is designated as resin AIII-9.

(18-1)

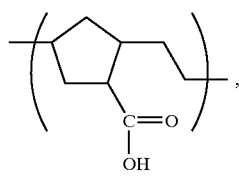

(18-2)

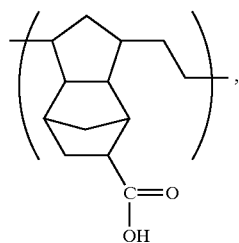

(18-3)

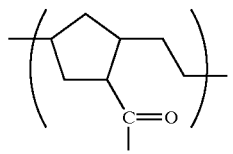 and (18-4)

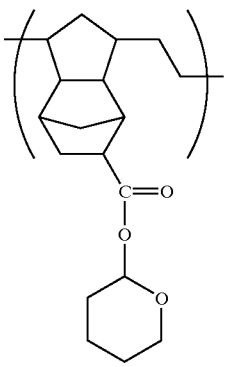

Synthesis Example 11

(1) Polymerization:

Into the separable flask as used in the step (2) in Synthesis Example 1, and in a stream of nitrogen, 40 parts by weight of 5-t-butoxycarbonylbicyclo[2.2.1]hept-2-ene and 20 parts by weight of 8-t-butoxycarbonyltetracyclo[$4.4.0.1^{2,5}.1^{7,10}$]dodec-3-ene, obtained in the step (1) in Synthesis Example 8, 20 parts by weight of 5-methyl-5-methoxycarbonylbicyclo[2.2.1]hept-2-ene, 24 parts by weight of 1-hexene (a molecular weight modifier) and 160 parts by weight of toluene were charged, followed by heating to 80° C. Subsequently, 15 parts by weight of a toluene solution of triethylaluminum serving as a metathesis catalyst (concentration: 0.123 mole/liter) and 9.3 parts by weight of a toluene solution of $WCl_6$ (concentration: 0.025 mole/liter) were added, followed by stirring at 80° C. for 3 hours to effect polymerization to obtain a solution of a random copolymer having repeating units represented by the following formulas (yield: 70% by weight). This resin is designated as resin A-16.

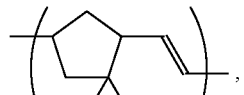

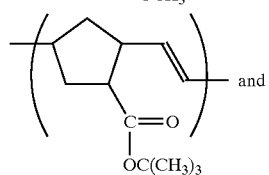 and

-continued

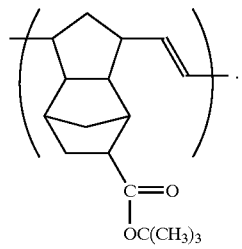

(2) Hydrogenation:

The resin A-16 was hydrogenated and purified in the same manner as in the step (3) of Synthesis Example 1 to obtain a random copolymer having a hydrogenation degree of 100% as measured by NMR spectroscopy and having repeating units represented by the following formulas. This resin is designated as resin AIV-5.

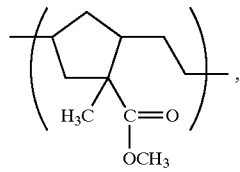

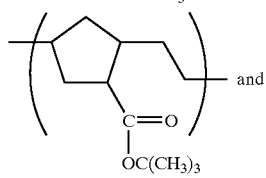

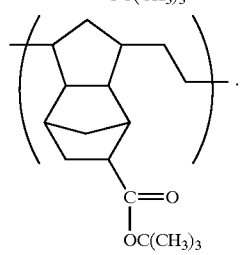

(3) Hydrolysis:

Into a flask, 100 parts by weight of the resin AIV-5, 200 parts by weight of propylene glycol monoethyl ether and 10 parts by weight of 20% by weight sulfuric acid were charged to carry out hydrolysis for 8 hours under reflux in an atmosphere of nitrogen. Subsequently, the reaction solution was cooled, and thereafter 200 parts by weight of water and 200 parts by weight of ethyl acetate were added to carry out extraction. Thereafter, the resin layer obtained was washed with water three times, and then dropwise added in a large quantity of n-hexane to again solidify the resin. The resin solidified was dried under reduced pressure.

The resin thus obtained was measured by infrared spectroscopy to confirm that the hydrolysis reaction quantitatively proceeded, and was a random copolymer having repeating units represented by the following formulas (19-1) to (19-3), the repeating units being at a molar ratio of (19-1)/(19-2)/(19-3)=33/52/15; and having an Mw of 32,000. This resin is designated as resin AIII-10.

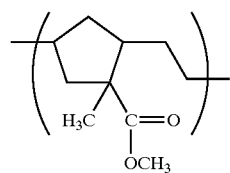

(19-1)

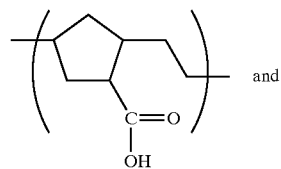

(19-2)

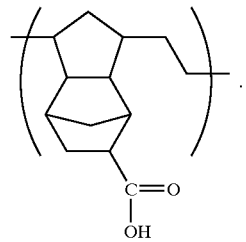

(19-3)

Synthesis Example 12
(Acid-cleavable Additive)

In a reactor were charged 10 parts by weight of 1,5-dihydronaphthalene, 29.2 parts by weight of di-t-butyl dicarbonate, 13.9 parts by weight of triethylamine and 100 parts by weight of dioxane, and they are heated to 70° C. to react for 5 hours. After the completion of the reaction, dioxane was distilled off, and then the residual matter was dissolved in ethyl acetate, washed with 5% by weight aqueous potassium hydroxide solution, and further washed with water twice. The resulting ethyl acetate solution was dehydrated with magnesium sulfate. From the dehydrated solution thus obtained, 1,5-bis(t-butoxycarbonyloxy)naphthalene having the structural formula below in a white crystalline state. The compound is referred to as C-2.

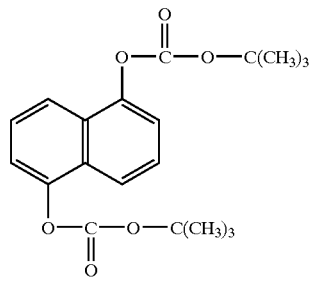

Example 1

A resin film formed using a tetrahydrofuran solution of the resin AII-1 obtained in Synthesis Example 1 was examined by measuring its radiation transmittance and etching rate. Results of the measurement are shown in Table 1.

Example 2

A resin film formed using a tetrahydrofuran solution of the resin AIII-2 obtained in Synthesis Example 1 was examined by measuring its radiation transmittance and etching rate. Results of the measurement, are shown in Table 1.

Example 3

Using azoisobutyronitrile as a polymerization initiator and t-dodecylmercaptan as a chain transfer agent, a t-butyl methacrylate, methyl methacrylate and methacrylic acid were polymerized to obtain a copolymer having a t-butyl methacrylate/methyl methacrylate/methacrylic acid compositional ratio of 40/50/10 and an Mw of 25,000. This copolymer is designated as acid-cleavable additive C1.

Subsequently, 50 parts by weight of the resin AIII-2, 50 parts by weight of the acid-cleavable additive C1 and 5 parts by weight of triphenylsulfonium trifurate (an acid-generating agent B1) were dissolved in a 80:20 (weight ratio) mixed solvent of 2-heptanone and ethyl 2-hydroxypropionate to prepare a composition solution. This solution is designated as composition solution α.

A resist film formed using the composition solution a was examined by measuring its radiation transmittance and etching rate. Results of the measurement are shown in Table 1.

Comparative Example 1

A resin film formed using a solution prepared by dissolving in ethyl 2-hydroxypropionate the acid-cleavable additive C1 obtained in Example 3 was examined by measuring its etching rate. Results of the measurement are shown in Table 1.

Comparative Example 2

100 parts by weight of cresol novolak resin with an Mw of 5,000 and 25 parts by weight of 1,2-quinonediazido-5-sulfonate of 2,3,4,4'-tetrahydroxybenzophenone (an acid-generating agent B2) were dissolved in ethyl 2-hydroxypropionate to prepare a composition solution. This solution is designated as composition solution β1.

A resist film formed using the composition solution β1 was examined by measuring its radiation transmittance. Results of the measurement are shown in Table 1.

TABLE 1

| | Resin | Acid-generating agent (B) | Acid-cleavable additive | Radiation transmittance (%) 248 nm | Radiation transmittance (%) 193 nm | Etching rate (Å/min) |
|---|---|---|---|---|---|---|
| Example 1 | AII-1 | — | — | 98.8 | 81.2 | 195 |
| Example 2 | AIII-2 | — | — | 98.8 | 74.2 | 220 |
| Example 3 | AIII-2 | B1 | C1 | 98.9 | 78.2 | 188 |
| Comparative Example 1 | — | — | C1 | — | — | 410 |
| Comparative Example 2 | Cresol-novolak resin | B2 | — | 25.2 | 0.02 | — |

Example 4

10 g of the composition solution β1 obtained in Comparative Example 2 was further diluted with 20 g of ethyl 2-hydroxypropionate to prepare a composition solution, designated as composition solution β2. The solution obtained was coated on a silicon substrate, followed by baking at a temperature of 300° C. to form a film with a layer thickness of 0.1 μm.

On the film thus formed, the composition solution a obtained in Example 3 was coated, followed by baking to form a resist film with a layer thickness of 0.6 μm. Thereafter, on this resist film, an aqueous solution of polyacrylic acid was coated to form an upper layer film.

Subsequently, the triple-layer film thus obtained was exposed to light using a KrF excimer laser stepper (NSR-2005 EX8A, manufactured by Nikon Corporation; numerical aperture: 0.50), followed by post-exposure baking. Thereafter, the film exposed was developed using an aqueous solution of 2.38% by weight of tetramethylammonium hydroxide, followed by washing with pure water and then drying. As a result, a positive line-and-space pattern with a line width of 0.3 μm was obtained in a good rectangular shape.

Examples 5 to 11

The resin AIII-4, AII-2, AII-4, AIII-5, AIII-6 or AII-b, which was obtained in one of synthesis Examples 2 to 7, was mixed with the following acid-generating agent B, Lewis base additive and solvent to form a uniform solution, followed by filtration with a membrane filter having a pore diameter of 0.2 μm. Thus, composition solutions as shown in Table 2 were prepared (in the table, "part(s)" is by weight).

Using the respective composition solutions thus obtained, positive resist patterns were formed under the developing conditions of a development time of 1 minute using an aqueous 2.38% by weight tetramethylammonium hydroxide solution [developing condition (i)] or a development time of 1 minute using an aqueous 0.238% by weight tetramethylammonium hydroxide solution [developing condition (ii)], and then each evaluation was made. Results of the evaluation are shown in Table 3.

Acid-generating Agent B
B3: Cyclohexylmethyl(2-oxocyclohexyl)sulfonium trifurate
B4: 4-Hydroxynaphthyldiemthylsulfonium trifurate
B5: Trifluoromethanesulfonylbicyclo[2.2.1]hept-5-ene-2,3-dicarboxyimide Lewis Base Additive
D1: Tri-n-butylamine
D2: 2-Hydroxypyridine Solvent
E1: Ethyl 2-hydroxypropionate
E2: n-Butyl acetate
E3: 2-Heptanone

TABLE 2

| | Resin (A) | (Parts) | Acid-generating agent (B) | (Parts) | Lewis base additive | (Parts) | Solvent (parts) |
|---|---|---|---|---|---|---|---|
| Example 5 | AIII-4 | (100) | B4 | (2.5) | D1 | (0.03) | E1/E3 (173/406) |
| Example 6 | AII-2 | (100) | B3 | (2.5) | D2 | (0.03) | E3 (580) |
| Example 7 | AII-4 | (100) | B4 | (2.5) | D1 | (0.03) | E3 (580) |
| Example 8 | AII-4 | (100) | B4 | (2.5) | D1 | (0.03) | E2/E3 |

TABLE 2-continued

|  | Resin (A) | (Parts) | Acid-generating agent (B) | (Parts) | Lewis base additive | (Parts) | Solvent (parts) |
|---|---|---|---|---|---|---|---|
| Example 9 | AIII-5 | (100) | B5 | (2.5) | D2 | (0.03) | E1/E3 (173/406) |
| Example 10 | AIII-6 | (100) | B4 | (2.5) | D1 | (0.01) | E1/E3 (173/406) |
| Example 11 | AII-b | (100) | B4 | (2.5) | D1 | (0.01) | E1 (420) |

TABLE 3

|  | Developing conditions | Radiation transmittance (193 nm; %) | Adhesion to substrate | Sensitivity (mJ/cm$^2$) | Resolution ($\mu$m) | Developability |
|---|---|---|---|---|---|---|
| Example 5 | (ii) | 63 | good | 17 | 0.22 | good |
| Example 6 | (i) | 68 | good | 18 | 0.22 | good |
| Example 7 | (i) | 71 | good | 22 | 0.22 | good |
| Example 8 | (ii) | 62 | good | 15 | 0.24 | good |
| Example 9 | (i) | 61 | good | 08 | 0.22 | good |
| Example 10 | (i) | 65 | good | 23 | 0.20 | good |
| Example 11 | (ii) | 65 | good | 35 | 0.25 | good |

Examples 12 to 17

The resin AIII-7, A11, A13, AIII-8, AIII-9 or AIII-10, which was obtained in one of synthesis Examples 8 to 11, was mixed with the aforesaid acid-generating agent B4, Lewis base additive D1 and solvent E3 to form a uniform solution, followed by filtration with a membrane filter having a pore diameter of 0.2 $\mu$m. Thus, composition solutions as shown in Table 4 were prepared (in the table, "part(s)" is by weight).

Using the respective composition solutions thus obtained, positive resist patterns were formed in the same manner as in Example 4 except for using a KrF excimer laser exposure device (manufactured by Nikon Corporation; number of lens aperture: 0.55), and then each evaluation was made. Results of the evaluation are shown in Table 5.

The resist pattern obtained in Example 12 was heated to 90° C. on a hot plate to examine how the pattern deformed. As a result, no change was observed at all, also showing a good heat resistance.

TABLE 4

|  | Resin (A) | (Parts) | Acid-generating agent (B) | (Parts) | Lewis base additive | (Parts) | Solvent (parts) |
|---|---|---|---|---|---|---|---|
| Example 12 | AIII-7 | (100) | B4 | (2.5) | D1 | (0.01) | E3 (500) |
| Example 13 | AIII-7 A-11 | (70) (30) | B4 | (2.5) | D1 | (0.01) | E3 (500) |
| Example 14 | AIII-8 | (100) | B4 | (2.5) | D1 | (0.01) | E3 (500) |
| Example 15 | AIII-8 A-13 | (50) (50) | B4 | (2.5) | D1 | (0.01) | E3 (500) |
| Example 16 | AIII-9 | (100) | B4 | (2.5) | D1 | (0.01) | E3 (500) |
| Example 17 | AIII-9 AIII-10 | (50) (50) | B4 | (2.5) | D1 | (0.01) | E3 (500) |
| Example 18 | AII-6a | (100) | B4 | (2.5) | D1 | (0.01) | E3 (500) |

TABLE 5

|  | Developing conditions | Radiation transmittance (193 nm; %) | Adhesion to substrate | Sensitivity (mJ/cm$^2$) | Resolution ($\mu$m) | Developability |
|---|---|---|---|---|---|---|
| Example 12 | (i) | 64 | good | 26 | 0.22 | good |
| Example 13 | (i) | 65 | good | 32 | 0.20 | good |
| Example 14 | (i) | 66 | good | 20 | 0.22 | good |
| Example 15 | (i) | 64 | good | 25 | 0.18 | good |
| Example 16 | (i) | 65 | good | 29 | 0.18 | good |
| Example 17 | (i) | 63 | good | 33 | 0.18 | good |
| Example 18 | (i) | 73 | good | 17 | 0.18 | good |

Example 19

80 parts by weight of the resin (AIII-3) obtained in Synthesis Example 2(3), 20 parts weight of the acid-cleavable additive (C-2) obtained in Synthesis Example 12, 1.5 parts by weight of (B-4) and 1.5 parts by weight of (B-3) as an acid-generating agent, 0.02 part by weight of the Lewis base additive (D-1) and 500 parts by weight of the solvent (E1) were mixed to produce a uniform solution, followed by filtration with a membrane filter having a pore diameter of 0.2 μm. Thus, a composition solution was prepared.

Using the composition solution thus obtained, a positive resist pattern wase formed in the same manner as in Example 5 except for using a ArF excimer laser exposure device (manufactured by Nikon K. K.; number of lens aperture: 0.55), and then each evaluation was made. Results of the evaluation are shown in Table 6.

TABLE 6

| | Radiation transmittance (193; nm %) | Adhesion to substrate | Sensitivity (mJ/cm²) | Resolution (μm) | Developability |
|---|---|---|---|---|---|
| Example 19 | 59 | good | 37 | 0.20 | good |

What is claimed is:

1. A radiation-sensitive resin composition comprising (A) a resin comprising an alicyclic skeleton in its backbone, and (B) a radiation-sensitive acid-generating agent capable of generating an acid upon irradiation with a radiation, wherein said alicyclic skeleton of the resin (A) is the alicyclic skeleton of the general formula (1):

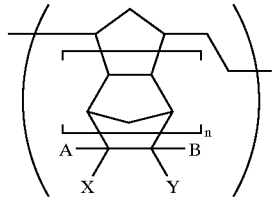

(1)

wherein in the general formula (1), n is 0 or 1, and A and B represent independently a hydrogen atom, a halogen atom, a monovalent hydrocarbon group having 1 to 10 carbon atoms or a monovalent halogenated hydrocarbon group having 1 to 10 carbon atoms, and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group.

2. The radiation-sensitive resin composition according to claim 1, wherein the acid-cleavable group is a group: —(CH$_2$)$_i$COOR$^1$, —(CH$_2$)$_i$OCOR$^2$ or —(CH$_2$)$_i$CN wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxyethyl group, a carbobutoxypropyl group or a trialkylsilyl group the alkyl groups of which each have 1 to 4 carbon atoms, R$^2$ represents a hydrocarbon group having 1 to 10 carbon atoms or a halogenated hydrocarbon group having 1 to 10 carbon atoms, and i is an integer of 0 to 4; or X and Y are bonded to each other to form a bivalent group represented by the formula:

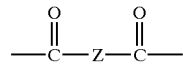

wherein Z is —O— or —N(R$^3$)— in which R$^3$ is a hydrogen atom, a halogen atom, an alkyl group having 1 to 8 carbon atoms or a —SO$_2$R$^4$ group having 1 to 4 carbon atoms in which R$^4$ is an alkyl group having 1 to 4 carbon atoms or a halogenated alkyl group having 1 to 4 carbon atoms, or the formula: —O—.

3. The radiation-sensitive resin composition according to claim 2, wherein the acid-cleavable group is a (cyclo)alkoxycarbonyl group.

4. The radiation-sensitive resin composition according to claim 2, wherein the resin (A) is comprised of a structural unit represented by the following general formula (3):

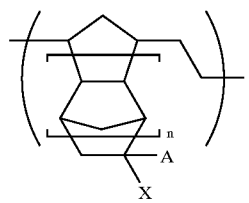

(3)

wherein n and A are as defined in respect of the general formula (1) in claim 1, and X represents an acid-cleavable group.

5. The radiation-sensitive resin composition according to claim 4, wherein said acid-cleavable group X is —(CH$_2$)$_i$COOR$^1$ where R$^1$ and i are as defined in claim 2.

6. The radiation-sensitive resin composition according to claim 4, wherein said structural unit of the general formula (3) is a structural unit represented by the general formula (3-1):

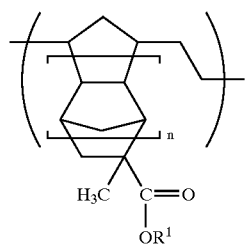

(3-1)

wherein n is 0 or 1, and R$^1$ is a hydrogen group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxyethyl group, a carbobutoxypropyl group or a trialkylsilyl group, the alkyl groups of which each have 1 to 4 carbon atoms.

7. The radiation-sensitive resin composition according to claim 4, wherein the resin (A) is comprised of a structural unit represented by the general formula (3) above and a structural unit represented by the general formula (4):

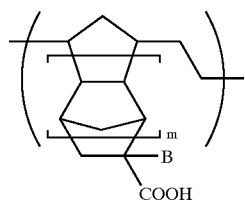

(4)

wherein m is 0 or 1, and B is as defined in respect of the general formula (1) in claim 1.

8. The radiation-sensitive resin composition according to claim 7, wherein said structural unit of the general formula (3) is a structural unit represented by the general formula (3-1) defined in claim 6 and said structural unit of the general formula (4) is a structural unit represented by the general formula (4-1):

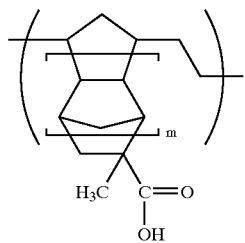

(4-1)

wherein m is 0 or 1.

9. The radiation-sensitive resin composition according to claim 6, wherein said acid-cleavable group X is —$(CH_2)_i$COOR$^1$ where R$^1$ and i are as defined in claim 2.

10. The radiation-sensitive resin composition according to claim 7, wherein the molar ratio of the structural unit of the general formula (3) to the structural unit of the general formula (4) ranges from 20/80 to 95/5.

11. The radiation-sensitive resin composition according to claim 2, wherein the resin (A) is comprised of a structural unit represented by the general formula (5) and a structural unit represented by the general formula (6):

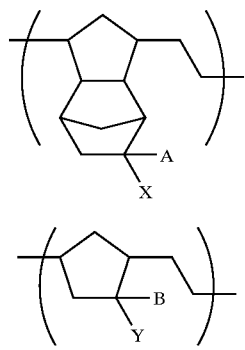

(5)

(6)

wherein in the general formula (5) and general formula (6), A and B are independently as defined for the general formulas (1) and (2), and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group.

12. The radiation-sensitive resin composition according to claim 11, wherein the structural unit represented by the general formula (5) is a structural unit represented by the formula (5-1) and the structural unit represented by the general formula (6) is a structural unit represented by the formula (6-1):

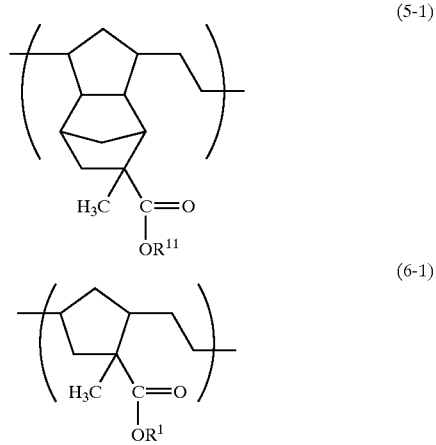

wherein in the general formula (5-1) and general formula (6-1), R$^1$ is a hydrogen group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxyethyl group, a carbobutoxypropyl group or a trialkylsilyl group, the alkyl groups of which each have 1 to 4 carbon atoms.

13. The radiation-sensitive resin composition according to claim 11 wherein said acid-cleavable group is —$(CH_2)_i$COOR$^1$ where R$^1$ and i are as defined in claim 2.

14. The radiation-sensitive resin composition according to claim 11, wherein the molar ratio of the structural unit of the general formula (5) to the structural unit of the general formula (6) ranges from 5/95 to 95/5.

15. The radiation-sensitive resin composition according to claim 2, wherein the resin (A) has a weight average molecular weight in terms of polystyrene, measured by gel permeation chromatography, of 5,000 to 300,000.

16. The radiation-sensitive resin composition according to claim 2, wherein the resin (A) has a glass transition point in the range of 80 to 180° C.

17. The radiation-sensitive resin composition according to claim 2, wherein the amount of the residual halogen contained in the resin (A) is 3 ppm or less, and the amount of the residual metal contained therein is 300 ppb or less.

18. The radiation-sensitive resin composition according to claim 2, wherein the acid-generating agent (B) is selected from the group consisting of onium salts, halogen-containing compounds, diazoketone compounds, sulfone compounds, and sulfonic acid compounds.

19. The radiation-sensitive resin composition according to claim 2, wherein the acid-generating agent (B) is contained in an amount of 0.1 to 10 parts by weight per 100 parts by weight of the resin (A).

20. A radiation-sensitive resin composition comprising (A) a resin compr sing an alicyclic skeleton in its backbone, and (B) a radiation-sensitive acid-generating agent capable of generating an acid upon irradiation with a radiation, wherein the resin comprises a copolymer of maleic anhydride and an alicyclic monomer represented by the general formula:

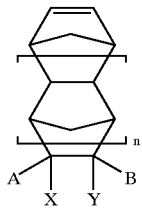

wherein n is 0 or 1, and A and B represent independently a hydrogen atom, a halogen atom, a monovalent hydrocarbon group having 1 to 10 carbon atoms or a monovalent halogenated hydrocarbon group having 1 to 10 carbon atoms, and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group, and wherein the resin further comprises in its backbone a repeating unit derived from maleic anhydride.

21. A radiation-sensitive resin composition comprising (A) a resin comprising an alicyclic skeleton in its backbone, and (B) a radiation-sensitive acid-generating agent capable of generating an acid upon irradiation with a radiation, wherein said alicyclic skeleton of the resin (A) is the alicyclic skeleton of the general formula (1):

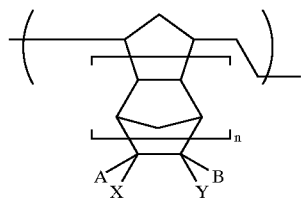

(1)

wherein in the general formula (1), n is 0 or 1, and A and B represent independently a hydrogen atom, a halogen atom, a monovalent hydrocarbon group having 1 to 10 carbon atoms or a monovalent halogenated hydrocarbon group having 1 to 10 carbon atoms, and X and Y represent independently a hydrogen atom, a halogen atom, a monovalent hydrocarbon group having 1 to 10 carbon atoms, a monovalent halogenated hydrocarbon group having 1 to 10 carbon atoms or an acid-cleavable group, provided that at least one of X and Y is an acid-cleavable group.

22. The radiation-sensitive resin composition according to claim 21, wherein the acid-cleavable group is a group: —(CH$_2$)$_i$COOR$^1$, —(CH$_2$)$_i$OCOR$^2$ OR—CH$_2$)$_i$CN wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxymethyl group, a carbobutoxypropyl group or a trialkylsilyl group the alkyl groups of which each have 1 to 4 carbon atoms, R$^2$ represents a hydrocarbon group having 1 to 10 carbon atoms or a halogenated hydrocarbon group having 1 to 10 carbon atoms, and i is an integer of 0 to 4; or X and Y are bonded to each other to form a bivalent group represented by the formula:

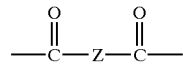

wherein Z is —O— or —N(R$^3$)— in which R$^3$ is a hydrogen atom, a halogen atom, an alkyl group having 1 to 8 carbon atoms or a —SO$_2$R$^4$ group having 1 to 4 carbon atoms in which R$^4$ is an alkyl group having 1 to 4 carbon atoms or a halogenated alkyl group having 1 to 4 carbon atoms, or the formula: —O—.

23. The radiation-sensitive resin composition according to claim 22, wherein the acid-cleavable group is a (cyclo) alkoxycarbonyl group.

24. The radiation-sensitive resin composition according to claim 21, wherein the resin (A) is comprised of a structural unit represented by the following general formula (3):

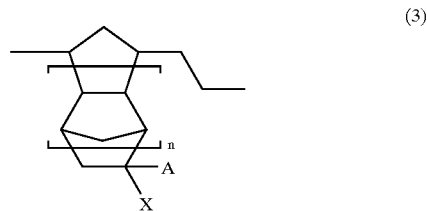

(3)

wherein n is 0 or 1, and A represents a hydrogen atom, a halogen atom, a monovalent hydrocarbon group having 1 to 10 carbon atoms or a monovalent halogenated hydrocarbon group having 1 to 10 carbon atoms, and X represents an acid-cleavable group.

25. The radiation-sensitive resin composition according to claim 24, wherein said acid-cleavable group X is —(CH$_2$)$_i$COOR$^1$, wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxyethyl group, a carbobutoxymethyl group, a carbobutoxypropyl group or a trialkylsilyl group the alkyl groups of which each have 1 to 4 carbon atoms and i is an integer of 0 to 4.

26. The radiation-sensitive resin composition according to claim 24, wherein said structural unit of the general formula (3) is a structural unit represented by the general formula (3-1):

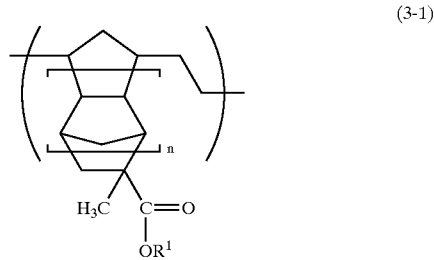

(3-1)

wherein n is 0 or 1, and R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxymethyl group, a carbobutoxypropyl group or a trialkylsilyl group, the alkyl groups of which each have 1 to 4 carbon atoms.

27. The radiation-sensitive resin composition according to claim 24, wherein the resin (A) is comprised of a structural unit represented by the general formula (3) and a structural unit represented by the general formula (4):

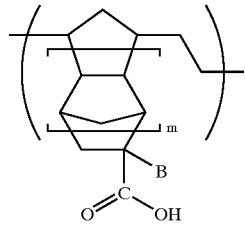

(4)

wherein m is 0 or 1, and B represents a hydrogen atom, a halogen atom, a monovalent hydrocarbon group having 1 to 10 carbon atoms or a monovalent halogenated hydrocarbon group having 1 to 10 carbon atoms.

28. The radiation-sensitive resin composition according to claim 27, wherein said structural unit of the general formula (3) is a structural unit represented by the general formula (3-1)

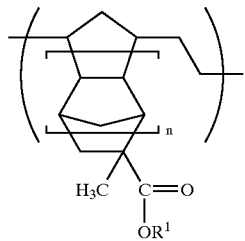

(3-1)

wherein n is 0 or 1 and $R^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxymethyl group, a carbobutoxypropyl group or a trialkylsilyl group, the alkyl groups of which each have 1 to 4 carbon atoms, and wherein said structural unit of the general formula (4) is a structural unit represented by the general formula (4-1)

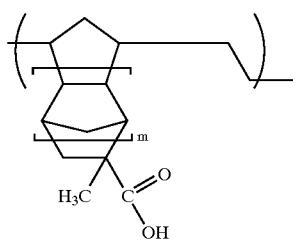

(4-1)

wherein m is 0 or 1.

29. The radiation-sensitive resin composition according to claim 26, wherein said acid-cleavable group X is —(CH$_2$)$_i$COOR$^1$, wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxymethyl group, a carbobutoxypropyl group or a trialkylsilyl group the alkyl groups of which each have 1 to 4 carbon atoms and i is an integer of 0 to 4.

30. The radiation-sensitive resin composition according to claim 27, wherein the molar ratio of the structural unit of the general formula (3) to the structural unit of the general formula (4) ranges from 20/80 to 95/5.

31. The radiation-sensitive resin composition according to claim 21, wherein the resin (A) is comprised of a structural unit represented by the general formula (5) and a structural unit represented by the general formula (6):

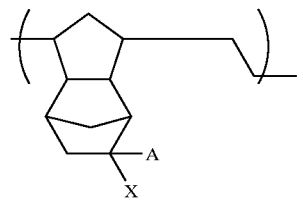

(5)

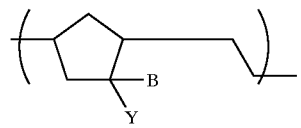

(6)

wherein in the general formula (5) and general formula (6), A and B are independently as defined for the general formula (1), and X and Y represent independently a hydrogen atom, a halogen atom, a monovalent hydrocarbon group having 1 to 10 carbon atoms or an acid-cleavable group, provided that at least one of X and Y is an acid-cleavable group.

32. The radiation-sensitive resin composition according to claim 31, wherein the structural unit represented by the general formula (5) is a structural unit represented by the formula (5-1) and the structural unit represented by the general formula (6) is a structural unit represented by the formula (6-1):

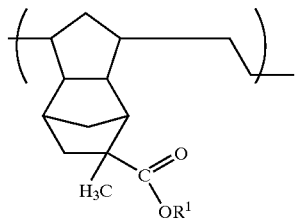

(5-1)

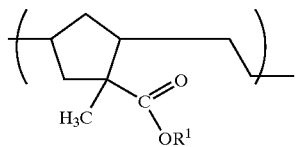

(6-1)

wherein the general formula (5-1) and general formula (6-1), $R^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxyethyl group, a carbobutoxymethyl group, a carbobutoxypropyl group or a trialkylsilyl group, the alkyl groups of which each have 1 to 4 carbon atoms.

33. The radiation-sensitive resin composition according to claim 31, wherein said acid-cleavable group is —(CH$_2$)$_i$COOR$^1$, wherein R$^1$ is a hydrocarbon group having 1 to 10 carbon atoms, a halogenated hydrocarbon group having 1 to 10 carbon atoms, a tetrahydrofuranyl group, a tetrahydropyranyl group, a carbobutoxymethyl group, a carbobutoxymethyl group, a carbobutoxypropyl group or a trialkylsilyl group the alkyl groups of which each have 1 to 4 carbon atoms and i is an integer of 0 to 4.

34. The radiation-sensitive resin composition according to claim 31, wherein the molar ratio of the structural unit of the general formula (5) to the structural unit of the general formula (6) ranges from 5/95 to 95/5.

35. The radiation-sensitive resin composition according to claim 21, wherein the resin (A) has a weight average molecular weight in terms of polystyrene, measured by gel permeation chromatography, of 5,000 to 300,000.

36. The radiation-sensitive resin composition according to claim 21, wherein the resin (A) has a glass transition point in the range of 80 to 180° C.

37. The radiation-sensitive resin composition according to claim 27, wherein the acid-generating agent (B) is selected from the group consisting of onium salts, halogen-containing compounds, diazoketone compounds, sulfone compounds, and sulfonic acid compounds.

38. The radiation-sensitive resin composition according to claim 21, wherein the acid-generating agent (B) is contained in an amount of 0.1 to 10 parts by weight per 100 parts by weight of the resin (A).

* * * * *